(12) United States Patent
Borleske

(10) Patent No.: US 10,921,353 B2
(45) Date of Patent: Feb. 16, 2021

(54) SYSTEMS, DEVICES, AND METHODS FOR A WIDE DYNAMIC RANGE CURRENT MEASUREMENT WITH CONSUMPTION EVENT ANALYSIS

(71) Applicant: Andrew J. Borleske, Garner, NC (US)

(72) Inventor: Andrew J. Borleske, Garner, NC (US)

( * ) Notice: Subject to any disclaimer, the term of this patent is extended or adjusted under 35 U.S.C. 154(b) by 402 days.

(21) Appl. No.: 15/676,318

(22) Filed: Aug. 14, 2017

(65) Prior Publication Data

US 2018/0045765 A1  Feb. 15, 2018

Related U.S. Application Data

(60) Provisional application No. 62/374,786, filed on Aug. 13, 2016.

(51) Int. Cl.
| | | |
|---|---|---|
| *G01R 19/25* | (2006.01) | |
| *G01R 19/165* | (2006.01) | |
| *G01R 19/17* | (2006.01) | |
| *G01R 35/00* | (2006.01) | |

(52) U.S. Cl.
CPC ... *G01R 19/2509* (2013.01); *G01R 19/16528* (2013.01); *G01R 19/17* (2013.01); *G01R 35/005* (2013.01)

(58) Field of Classification Search
CPC .......... G01R 19/16528; G01R 35/005; G01R 19/2509; G01R 19/17
See application file for complete search history.

(56) References Cited

U.S. PATENT DOCUMENTS

| | | | |
|---|---|---|---|
| 8,073,384 B2 | 12/2011 | Shuey et al. | |
| 2008/0215264 A1* | 9/2008 | Spanier | G01R 19/2513 |
| | | | 702/62 |

FOREIGN PATENT DOCUMENTS

| | | |
|---|---|---|
| WO | 2003071652 A2 | 8/2003 |
| WO | 2007067590 A1 | 6/2007 |
| WO | 2009082761 A1 | 7/2009 |

OTHER PUBLICATIONS

International Preliminary Report on Patentability and Written Opinion issued in PCT Application No. PCT/US2017/046747 dated Feb. 19, 2019 (Five (5) pages).

International Search Report and Written Opinion issued in counterpart PCT Application No. PCT/US2017/046747 dated Nov. 16, 2017 (seven (7) pages).

\* cited by examiner

*Primary Examiner* — Yoshihisa Ishizuka
(74) *Attorney, Agent, or Firm* — Olive Law Group, PLLC

(57) ABSTRACT

Systems, devices, and methods for a wide dynamic range current measurement with consumption event analysis are disclosed. According to an aspect, a method includes analyzing a plurality of a set of input data characteristics from a device under test. The method also includes totalizing the set of input data characteristics. The method also includes determining whether at least one of the plurality of the set of input data characteristics occurs above a quiescent level. Further, the method includes establishing an event in response to determining that at least one of the plurality of the set of input data characteristics occurs above the quiescent level. The method also includes creating a summary statistic based on the plurality of the set of input data characteristics. Further, the method includes storing the summary statistic and the event as a result.

28 Claims, 19 Drawing Sheets

FIG. 14

SYSTEMS, DEVICES, AND METHODS FOR A WIDE DYNAMIC RANGE CURRENT MEASUREMENT WITH CONSUMPTION EVENT ANALYSIS

CROSS REFERENCE

This application claims the benefit of the U.S. Provisional Application Ser. No. 62/374,786 filed on Aug. 13, 2016 and titled WIDE DYNAMIC RANGE CURRENT MEASUREMENT DEVICES WITH CONSUMPTION EVENT ANALYSIS AND RELATED METHODS, the disclosure of which is incorporated herein by reference in its entirety.

TECHNICAL FIELD

The presently disclosed subject matter relates to electronic devices. More particularly, the presently disclosed subject matter relates to systems, devices, and methods for a wide dynamic range current measurement device with consumption event analysis.

BACKGROUND

Today's battery powered, network enabled devices have a very wide range of current consumption. In order to conserve their battery life, they must operate at a very low current, i.e. sleep current, for a large portion of their operational lifetime. Their primary operation (reading sensors, actuating other devices etc.) often consumes a moderate level of current and can often take a very short period of time. To communicate to a network, these devices often use radio frequency (RF) communications. This can draw a very large amount current, typically for a relatively short period of time. Devices like this can often range from hundreds of nano-amperes to amperes in current. In order to size the battery correctly and verify that a device can reach its expected lifetime, developers of these devices must be able to measure all the current the device uses. That is, companies producing these devices must measure each segment of current consumption in a device using available tools and sum them all together. This methodology is error prone, tedious, and does not provide a way to fully validate the engineer's measurements in the normal operating environment of the device.

In view of the foregoing, it is desirable to provide systems and techniques for a wide dynamic range current measurement with consumption event analysis.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Disclosed herein are systems, devices, and methods for a wide dynamic range current measurement with consumption event analysis. According to an aspect, a method includes analyzing a plurality of a set of input data characteristics from a device under test. The method also includes totalizing the set of input data characteristics. The method also includes determining whether at least one of the plurality of the set of input data characteristics occurs above a quiescent level. Further, the method includes establishing an event in response to determining that at least one of the plurality of the set of input data characteristics occurs above the quiescent level. The method also includes creating a summary statistic based on the plurality of the set of input data characteristics. Further, the method includes storing the summary statistic and the event as a result.

BRIEF DESCRIPTION OF THE DRAWINGS

The foregoing summary, as well as the following detailed description of various embodiments, is better understood when read in conjunction with the appended drawings. For the purposes of illustration, there is shown in the drawings exemplary embodiments; however, the presently disclosed subject matter is not limited to the specific methods and instrumentalities disclosed. In the drawings:

FIG. 14 depicts an example test configuration for a wide dynamic range current measurement with consumption event analysis in accordance with embodiments of the present disclosure.

DETAILED DESCRIPTION

Figure 1:
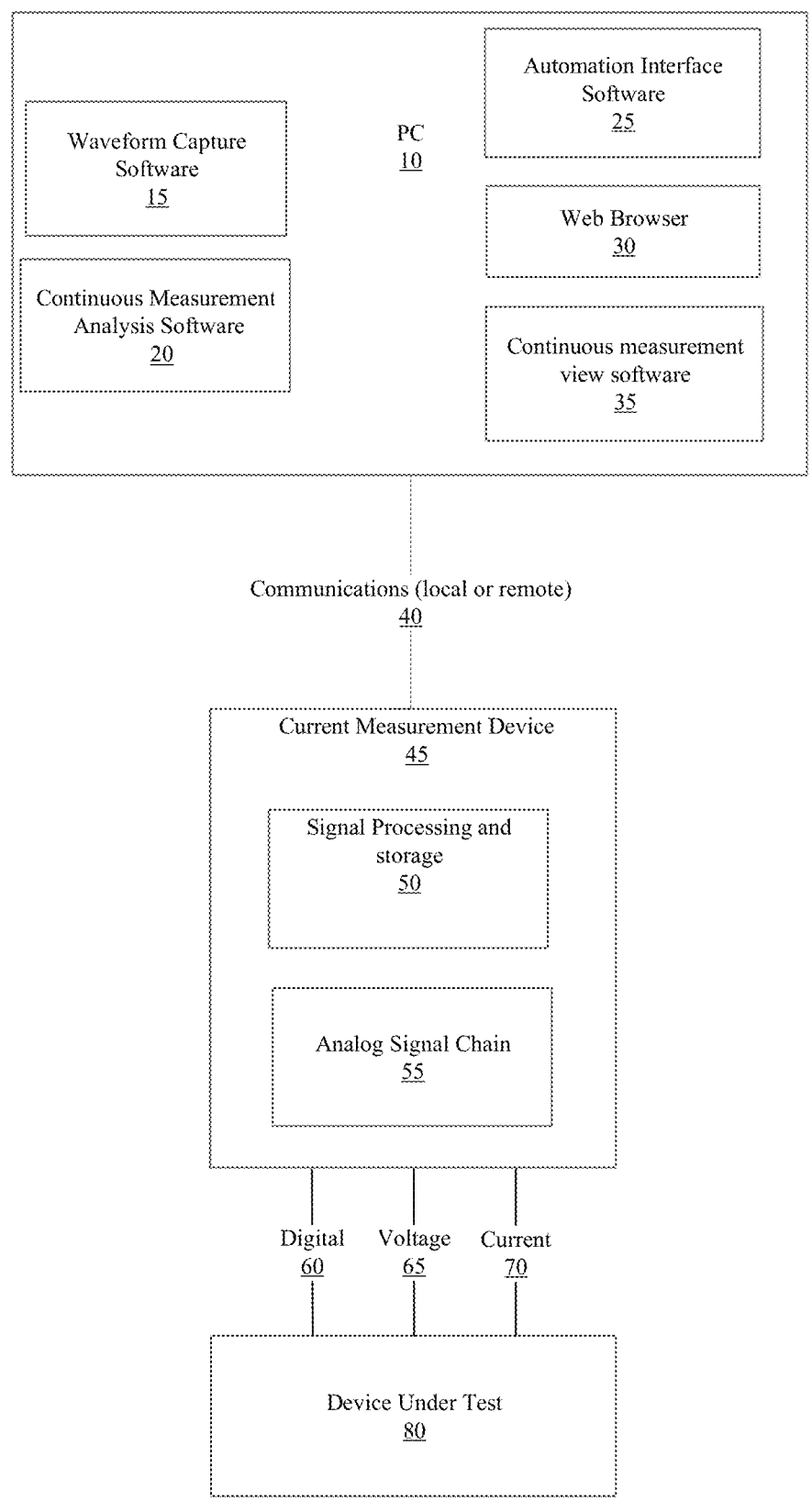
FIG. 1 is a block diagram of an example system for wide dynamic range current measurement with consumption event analysis in accordance with embodiments of the present disclosure.

The presently disclosed subject matter is described with specificity to meet statutory requirements. However, the description itself is not intended to limit the scope of this patent. Rather, the inventors have contemplated that the claimed subject matter might also be embodied in other ways, to include different steps or elements similar to the ones described in this document, in conjunction with other present or future technologies.

Modern battery powered, network enabled devices possess a wide range of current consumption. While their primary operation consumes a moderate level of current in a very short period of time, they need to draw a very large amount current in order to communicate with network devices. Such network enabled devices like this can often range from hundreds of nano-amperes to amperes in current. This is a dynamic range of 10,000,000:1. In order to size the battery correctly and verify that such a device can reach its expected lifetime, developers of these devices must be able to measure all the current the device uses. Companies producing these devices must measure each segment of current consumption in a device using available tools and sum them all together. This methodology is error prone, tedious, and does not provide a way to fully validate the engineer's measurements in the normal operating environment of the device.

Thus, devices and methods in accordance with embodiments of the present disclosure are needed to provide a way to measure current over approximately a 10,000,000:1 range since there are presently no products on the market that can measure this wide of a range while possessing a fast enough sample rate to accurately measure the current consumption. Therefore, in accordance with the embodiments, the present disclosure provides systems, devices, and methods for a wide dynamic range current measurement with consumption event analysis.

As referred to herein, the term "computing device" should be broadly construed. It can include any type of device including hardware, software, firmware, the like, and combinations thereof. A computing device may include one or more processors and memory or other suitable non-transitory, computer readable storage medium having computer readable program code for implementing methods in accordance with embodiments of the present disclosure. In another example, a computing device may be any type of conventional computer, such as a laptop computer or a tablet computer or a desktop computer. In another example, a computing device may be a mobile computing device such as, for example, but not limited to, a smart phone, a cell phone, a pager, a personal digital assistant (PDA), a mobile computer with a smart phone client, or the like. A typical mobile computing device is a wireless data access-enabled device (e.g., an iPHONE® smart phone, a BLACK-BERRY® smart phone, a NEXUS ONE™ smart phone, an iPAD® device, or the like) that is capable of sending and receiving data in a wireless manner using protocols like the Internet Protocol, or IP, and the wireless application protocol, or WAP. This allows users to access information via wireless devices, such as smart phones, mobile phones, pagers, two-way radios, communicators, and the like. Wireless data access is supported by many wireless networks, including, but not limited to, CDPD, CDMA, GSM, PDC, PHS, TDMA, FLEX, ReFLEX, iDEN, TETRA, DECT, DataTAC, Mobitex, EDGE and other 2G, 3G, 4G and LTE technologies, and it operates with many handheld device operating systems, such as PalmOS, EPOC, Windows CE, FLEXOS, OS/9, JavaOS, iOS and Android. Typically, these devices use graphical displays and can access the Internet (or other communications network) on so-called mini- or micro-browsers, which are web browsers with small file sizes that can accommodate the reduced memory constraints of wireless networks. In a representative embodiment, the mobile device is a cellular telephone or smart phone that operates over GPRS (General Packet Radio Services), which is a data technology for GSM networks. In addition to voice communication, a given mobile device can communicate with another such device via many different types of message transfer techniques, including SMS (short message service), enhanced SMS (EMS), multi-media message (MMS), email WAP, paging, or other known or later-developed wireless data formats. Although many of the examples provided herein are implemented on servers in a datacenter, the examples may similarly be implemented on any suitable computing device or computing devices.

The presently disclosed subject matter is now described in more detail. FIG. 1 is a block diagram of an example system for wide dynamic range current measurement with consumption event analysis. FIG. 1 illustrates a block diagram of a system level view. The computing device, such as a personal computer (PC) 10, is the user interface for the current measurement device 45, and can run a variety of software tools to either process data in real time or read out and analyze the summary data that has previously been stored in the current measurement device 45. The waveform capture software 15 is used to visualize and analyze the raw current, voltage, and digital data in a graphical view. The continuous measurement analysis software 20 also takes in the raw data, but processes it for events. In this mode, it takes over all the normal processing in the current measurement device 45 because it has much greater storage and processing capabilities. The continuous measurement view software 35 is used to view and analyze the summary of current consumption, as well as all of the logged events. A web browser 30 can also be used in the same way by loading an HTML page from the current measurement device 45 that provides the same continuous measurement view 35 functionality. Further, the automation interface software 25 gives access to the underlying data, as well as the processed data to be used by third party applications. The underlying data is the raw current data and also the voltage and digital data. This is needed to integrate the data into various systems developed by third parties without requiring changes to the underlying software. The software on the PC 10 communicates to the current measurement device through any typical communications interface 40, either local or remote (i.e. USB, serial, or Ethernet). This interface 40 must be of sufficient speed to transfer the data being analyzed.

Still referring to FIG. 1, the waveform capture software 15 and continuous measurement analysis software 30 require a high-speed link such as USB or gigabit Ethernet, while the continuous measurement view software 35, and the browser based software 30 can communicate over any common link as there are no timing constraints because the data is processed within the current measurement device 45.

The current measurement device 45 contains both the signal processing and storage section 50 to store and process data, as well as the analog signal chain 55 that conditions, amplifies, and converts the data into digital outputs. The device under test 80 is the device whose current 70 is being measured. The current path would pass through the current measurement device 45 so that it can be measured. Additionally, voltage 65 and digital 60 points can be measured on the device under test 80 to give the user additional information.

Figure 2:
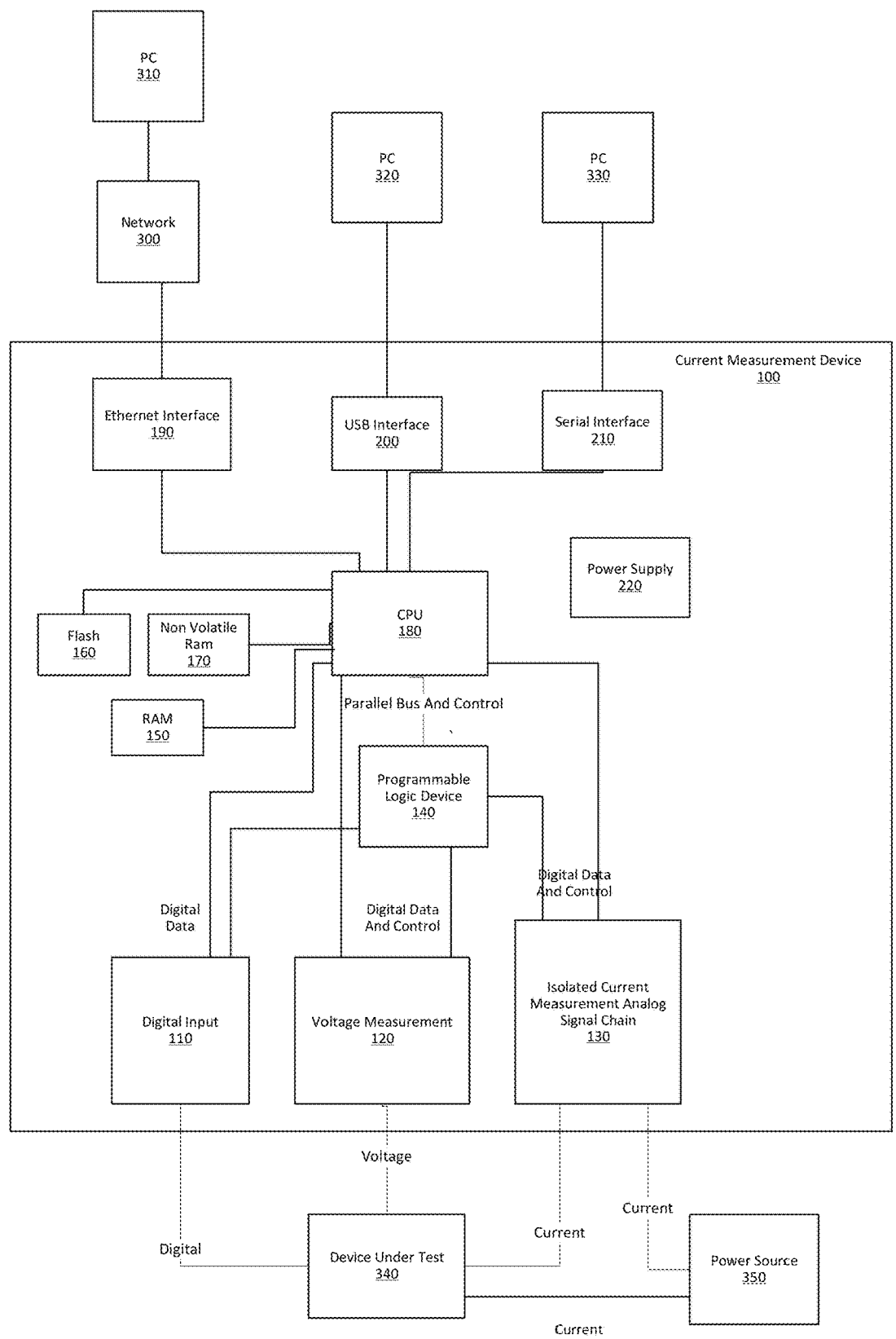
FIG. 2 is a block diagram of an example current measurement device for wide dynamic range current measurement with consumption event analysis in accordance with embodiments of the present disclosure.

FIG. 2 illustrates a block diagram of an example current measurement device 100 in accordance with embodiments of the present disclosure operating within an example system. Referring to FIG. 2, the computing device, such as a personal computer (PC), depicted as the three PCs 310, 320, and 330 represent the three ways a user can connect a computing device to the current measurement device 100. In an example configuration, only one is used. PC 330 is connected through a serial link 210 such as a RS-232 or any other suitable link. This is a low speed link, but is commonly used in test environments, and is sufficient to read out summary and log data from the current measurement device 100. PC 320 is connected through a high-speed USB connection 200, but this may be any suitable high speed local connection. This can be used in waveform capture 15 mode wherein a large amount of data needs to be transferred, as well as any of the other data that may be transported over a lower speed link. PC 310 is connected to a network 300 that is connected to the current measurement device 100. The network 300 connection between the device 100 and the network is typically Ethernet 190, but may be any suitable network connection such as WI-FI®. This link can be used to transport any of the data that can be transported over the low speed link. Additionally, the summary data can be viewed through a web browser 30 on the PC 10 without any additional software needed. If this link is fast enough (for example, gigabit Ethernet), then the high bandwidth waveform capture mode 15 could be run over it. Another feature of the network 300 connection is that it can be used to run the Network Time Protocol (NTP) to time synch the device. This can maintain accurate time stamps for all events over long test durations and also allows a test to carry on after a power failure, thus maintaining accurate time stamps even after a power loss.

Still referring to FIG. 2, the positive terminal of the power source 350 (which may be a battery) is connected to the high side of the Isolated Current Measurement Analog Signal Chain 130. The low side of the analog signal chain 130 is connected to the positive supply input to the device under test 340. The negative supply input to the device under test 340 is connected to the negative supply of the power source 350 to complete the current loop. This configuration allows all current consumed by the device under test 340 to be measured by the analog signal chain 130. In addition to the current connections, the device under test 340 can be connected to the voltage measurement input 120 and the digital input 110. These are optional connections not needed for current measurement, but can be used to gather additional information. The voltage connection 120 is often connected across the power source 350 to monitor for any changes in the source voltage due to high current draw or to calculate total energy consumed. Additionally, this data can be viewed in waveform capture mode 15 as informative data or to trigger the input.

Still referring to FIG. 2, in an example, the digital input 110 is typically a 4-8 bit parallel input plus a ground reference. This data is typically used in waveform capture mode 15 as a trigger, an additional information to view, or an event identifier in the automatic current characteristic mode 25. The data going into the digital input 110 is typically buffered and then sent to the programmable logic device 140 or the central processing unit (CPU) 180. The voltage measurement block 120 contains everything needed to sample and digitize an analog voltage (i.e. it contains, in an example, amplifiers, a voltage reference, and an analog-to-digital converter). The digital data output and control input are connected either to the programmable logic device 140 or the CPU 180. The data from the analog signal chain 130 has two serial data busses feeding the programmable logic device 140, as well as the control lines controlling the conversions and the bypass switch. The programmable logic device 140 converts the serial data streams of the analog signal chain 130 to a parallel stream of data to send to the CPU 180. Additionally, the data from the voltage measurement 120 and the digital input 110 can be included in this parallel stream of data.

Still referring to FIG. 2, the CPU 180 runs the software to process the data. This software takes the two streams of, in an example, a 16-bit data from the analog signal chain 130. The software then applies the offset and gain factors to get two calibrated current numbers. The software within the CPU 180 can then compare the low gain side number to a threshold that represents the crossover between the high gain side and the low gain side. If the low gain side number is greater than the threshold, then the software can multiply the low gain value by a difference in total gain between the two sides and store this calculated value in a 32-bit result. If the low gain side number is less than the threshold, then the high gain number is copied into the result. The resultant number is the true instantaneous current value. This value is stored with the voltage and digital data captured at the same time to either be sent to the waveform capture software 15, or be used internally by the CPU 180 if it is in continuous measurement mode 20. The CPU 180 uses the RAM 150 for local storage and buffering during its calculations. When in continuous measurement mode 20, the CPU 180 can store all events logged in flash 160, and can periodically write all of its test status to Non-Volatile RAM 170. This allows the test to restart at where it left off at in the event of a power failure. The CPU 180 uses local data buses to communicate with serial interface 210, USB interface 200, and Ethernet interface 190. These interfaces are used to communicate with an external PC 310, 320, 330, as was previously described.

Figure 3:
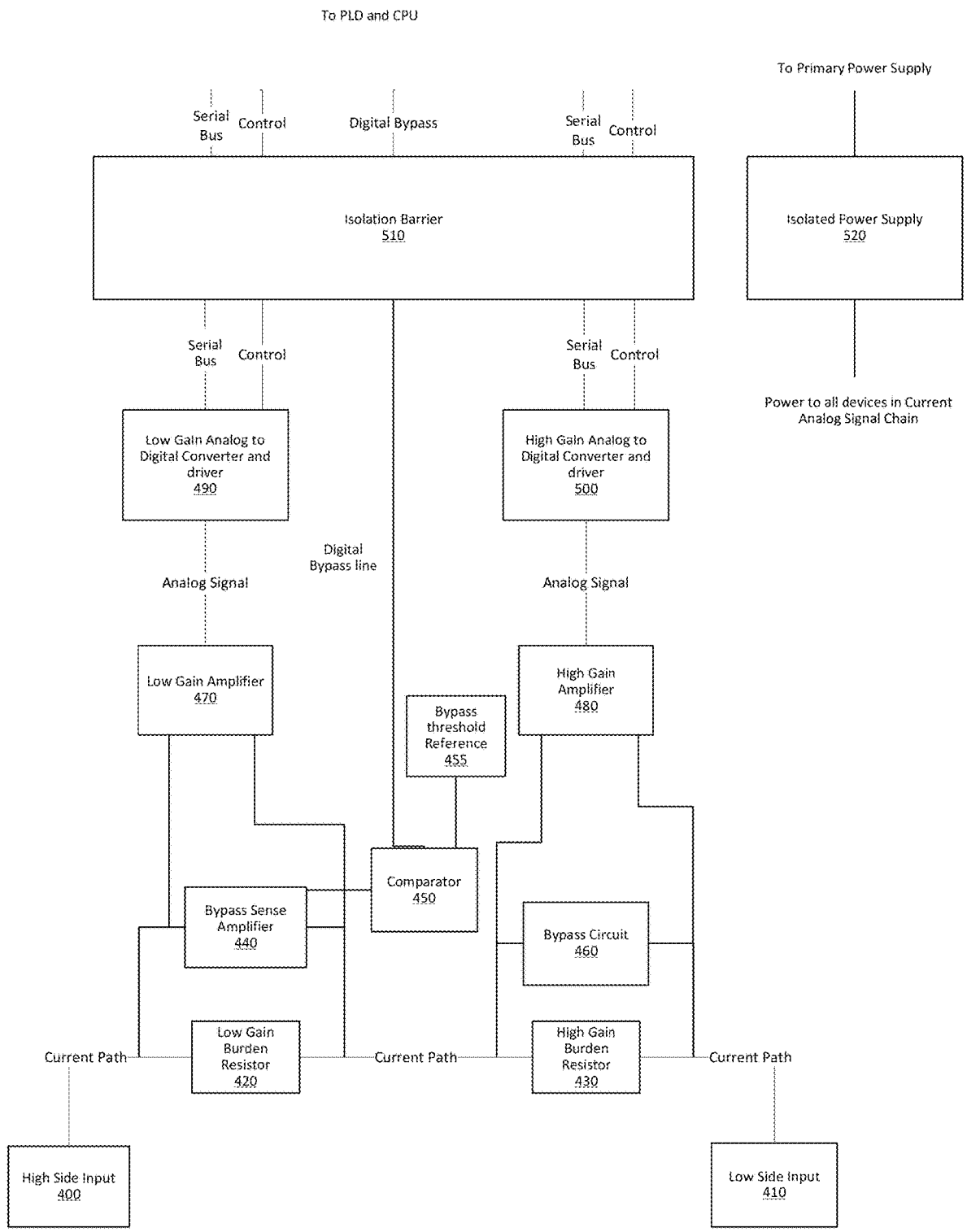
FIG. 3 is a diagram of an example current signal chain method for wide dynamic range current measurement with consumption event analysis in accordance with embodiments of the present disclosure.

FIG. 3 illustrates a block diagram of an example analog signal chain in accordance with embodiments of the present disclosure. The current to be measured enters at the high side input 400, flows across the low gain burden resistor 420, and either the high gain burden resistor 430, or the bypass circuit 460 before flowing out of the low side input 410. The current across the low gain burden resistor 420 can be measured by the bypass sense amplifier 440. In an example, this is a high gain and fast response amplifier. The amplified voltage can be compared to a threshold value provided reference 455 by using a comparator 450. Additionally, the comparator 450 may take in a digital input to force it into bypass mode (which is the same as the current exceeding the threshold) regardless of how much current is flowing.

Still referring to FIG. 3, the output of the comparator 450 may feed into the bypass circuit 460. In an example, the bypass circuit 460 is typically a metal oxide semiconductor field effect transistor (MOSFET) driven by a MOSFET driver, but may be any suitable current switching device with sufficiently low impedance when in the bypass state. The low gain amplifier 470 measures the voltage drop across the low gain burden resistor 420. The low gain amplifier 470 is in parallel with the bypass sense amplifier 440, but the former has a different gain and contains filtering for lower noise. The high gain amplifier 480 measures the voltage drop across the high gain burden resistor 430 when the bypass circuit 460 is open. If the bypass circuit 460 is closed, then the high gain measurement can be used to calibrate the system offset for the high gain signal chain.

Still referring to FIG. 3, the low 470 and high 480 gain amplifiers can feed their amplified voltage to their respective analog-to-digital converters and drivers 490 and 500. The analog converter blocks 490 and 500 contain a driver amplifier, a high precision analog-to-digital converter, and a voltage reference used to convert the analog voltage into a serial data stream. The analog converter blocks 490 and 500 also contain a high speed and a high precision analog-to-digital converter, such as a 16-bit analog-to-digital converter in an example.

The data and control lines from the converters 490 and 500, and the digital bypass line to the comparator 450 go through an isolation barrier 510 before being connected to the rest of the system. The isolation barrier 510 can remove the need for a common ground reference between the analog signal chain 130 and the rest of the system. The isolated power supply 520 can take power from the main system supply and provides isolated power to all the circuits in the analog signal chain 130.

Figure 4:
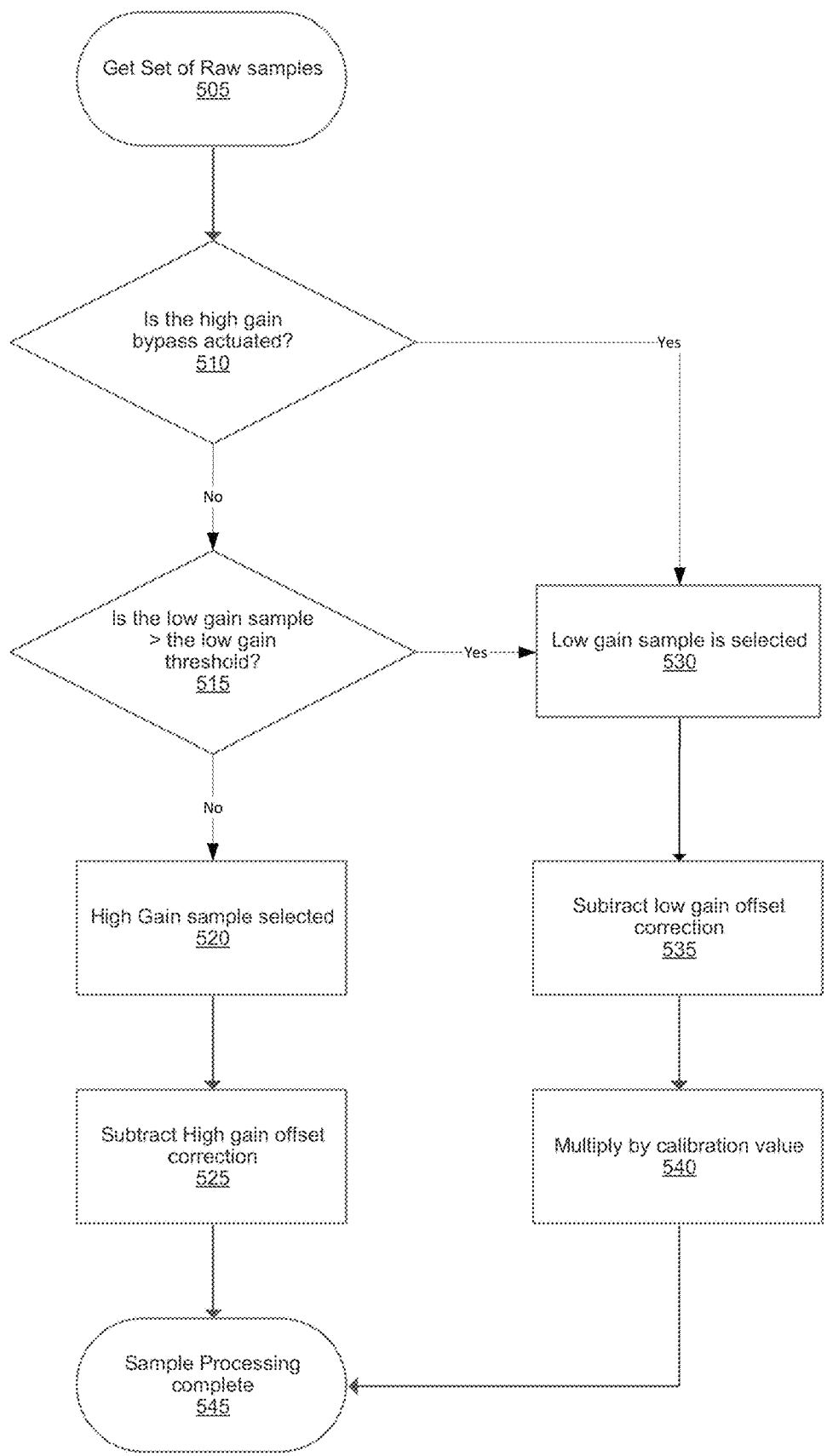
FIG. 4 is a flow chart of an example raw sample process flow for wide dynamic range current measurement with consumption event analysis in accordance with embodiments of the present disclosure.

FIG. 4 describes the process flow for the raw current data to convert multiple samples to a single full range sample. The flow starts with obtaining a pair of current measurements (i.e. set 505 of raw samples) from the low and high gain signal chains. If the high gain bypass is manually actuated 510, then the low gain sample is selected 530. Otherwise, the low gain sample is compared to a threshold 515 indicating the point at which the numerically significant sample switches from a high gain sample to a low gain sample. If the low gain sample is greater than this threshold, then the low gain sample is selected 530. If the low gain sample is selected, then the offset calibration is subtracted 535, and the gain multiplier is applied 540 (i.e. the difference between the gain in the high gain side from the low gain side) to end 545 with a sample in the units of the high gain side. If the answer to step 515 is no, then the high gain side was selected 520 and the high gain offset calibration is subtracted 525 to get to the full range sample at the end 545.

Figure 5A:
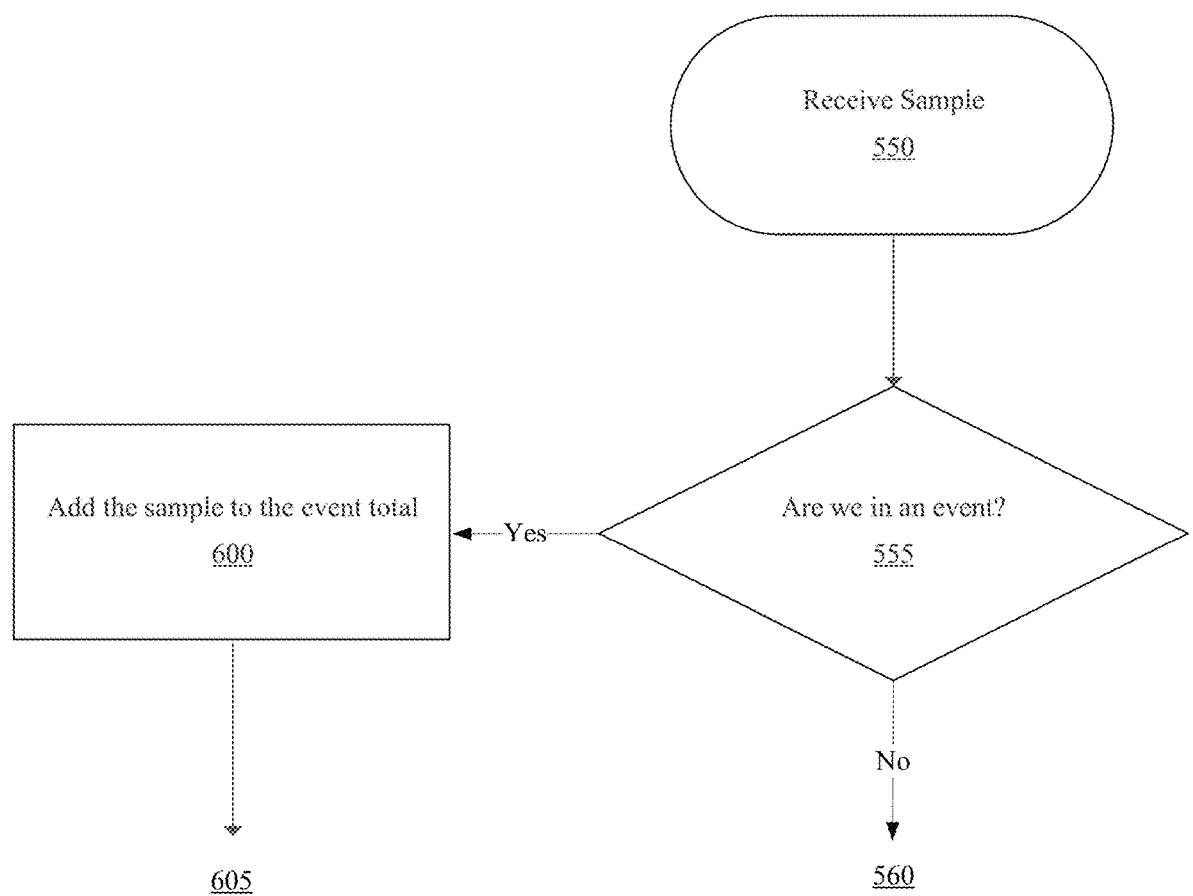
FIG. 5A and FIG. 5B show a detailed flow chart for an example sample process flow for wide dynamic range current measurement with consumption event analysis in accordance with embodiments of the present disclosure.
Figure 5B:
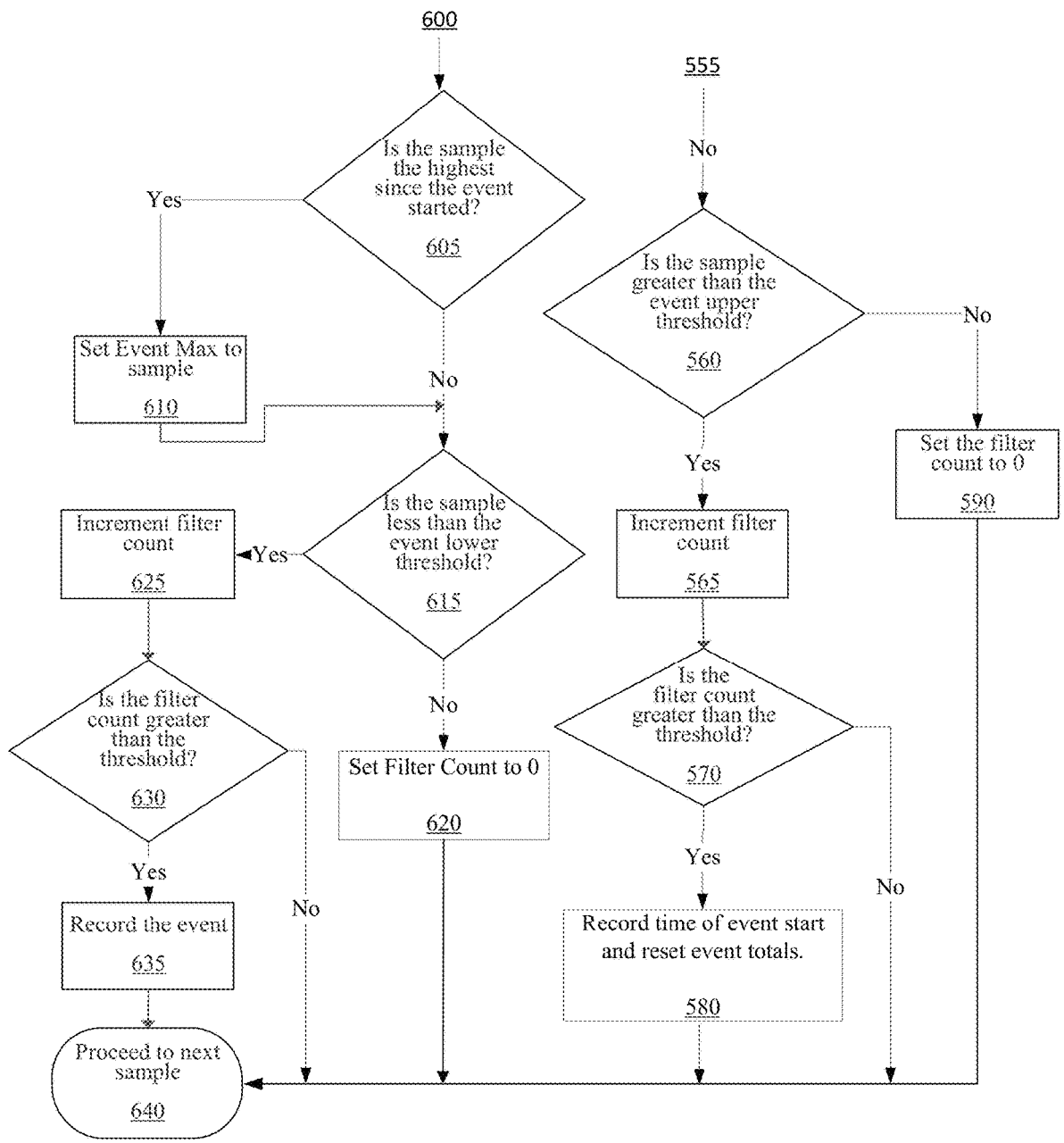

FIG. 5A and FIG. 5B describe the process flow to find the current events from the full range current samples. It starts with receiving 550 a full range sample (as processed from FIG. 4). If the device 45, 100 is not currently indicating that it is in an event 555, then the device 45, 100 can compare the sample to an event trigger threshold 560. If the sample is less than this threshold, then the device 45, 100 can set the event filter count to zero 590, and exit the sample processing 640. If the sample is greater than the threshold 560, then the device 45, 100 can increment the filter count 565. If the filter count is less than the threshold 570, the sample processing is complete and we proceed 640 to the next sample. If the filter count is greater than the threshold 570, then an event has started 580, and the time is recorded 580, and all the event totals are zeroed out 580. This ends the event processing for that sample and we proceed 640 to the next sample. If the device 45, 100 is in an event when the sample is processed, then the device 45, 100 can add the sample value to the total for the event 600. The device 45, 100 can then compare the sample value to the max value recorded during the event 605. If the sample value is greater than the max value, then the max value can be set to the sample value 610. The device 45, 100 can then compare the sample to the lower event threshold 615. If the sample is not less than this threshold, then the filter count can be set to zero 615, and the processing for this sample is complete 640. If the sample is less than the lower event threshold, then the filter count may be incremented 625. If the filter count is not greater than the threshold 630, then the event processing is complete 640. If the filter count is greater than the threshold, then the event has ended and the event can be recorded 635. This concludes the sample processing 640.

Figure 6A:
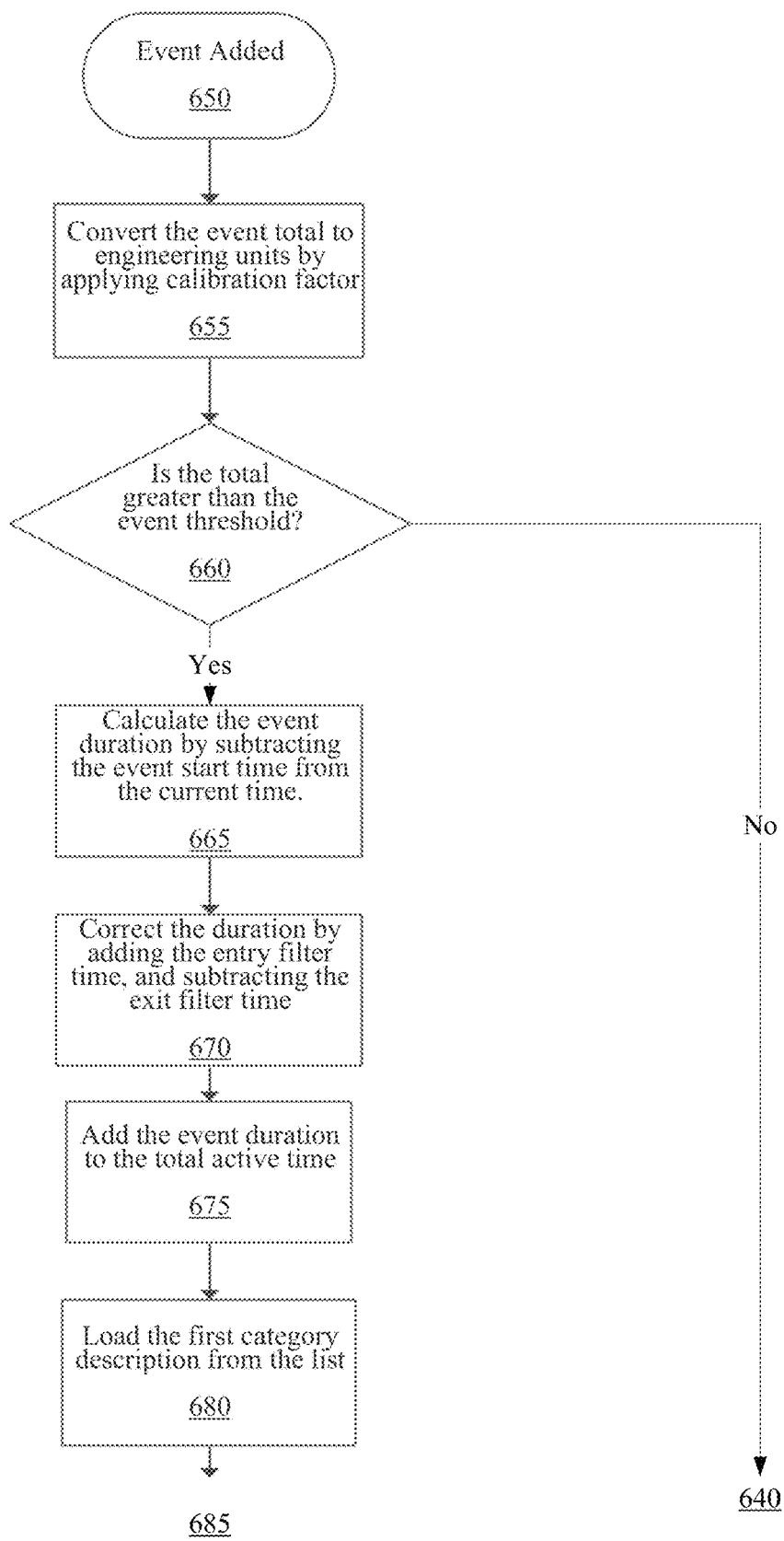
FIG. 6A and FIG. 6B show a detailed flow chart for an example event process flow for wide dynamic range current measurement with consumption event analysis in accordance with embodiments of the present disclosure.
Figure 6B:
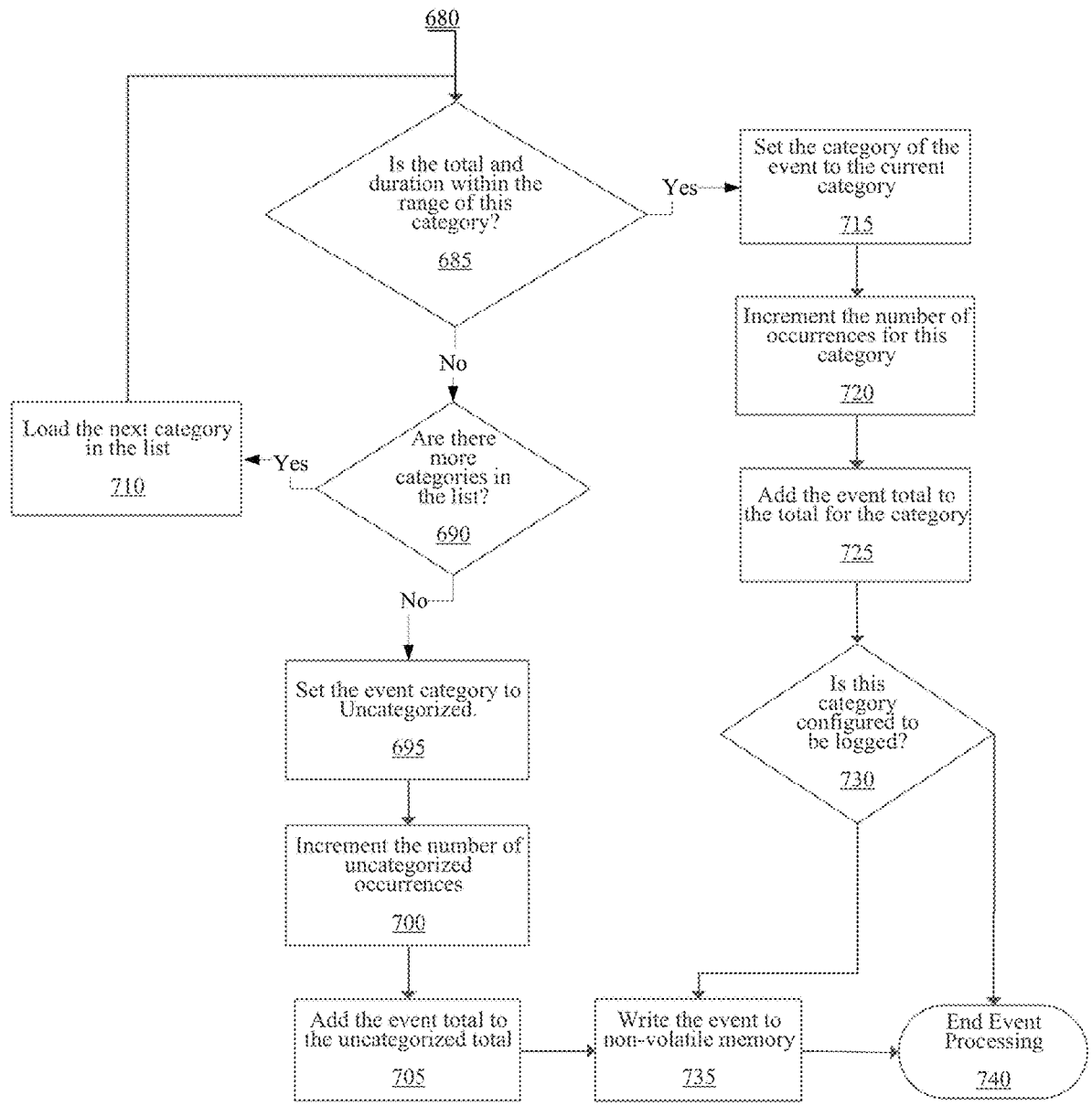

FIG. 6A and FIG. 6B describe the event processing flow. The process starts when a new event has been added 650 from the sample processing flow (as previously described in FIG. 5A and FIG. 5B). The event total is converted 655 to engineering units using the sample calibration factor. In an example, the engineering units are nano-amperes. The event total is then compared 660 to the minimum event threshold. If the event total is less than 660 the minimum threshold, then the event is not recorded, and the event processing concludes 740. If the event total is greater than 660 the minimum threshold, then the event duration is calculated 665 by subtracting the event start time from the current time. Then the event duration is corrected 670 by adding the entry filter time, and subtracting the exit filter time 670. The event total is then added to the total active time. Next, the category lookup starts by loading 680 the description of the first category. The event total and duration are then compared 685 to the range of totals and durations for the category. If the event is not within these ranges, then the next category description is loaded 710 and the comparison 685 is repeated. If there are no more categories 690, then the event is labeled as uncategorized 695. The number of uncategorized events is then incremented 700 and the event total is added to the uncategorized total 705, and the event is then written into non-volatile memory 735, and the event processing concludes 740. If the event is within the category ranges, then the event is labeled as that category type 715. The number of occurrences for that category is then incremented 720, and the total for the event is added to the category total 725. If the category is not configured to be logged 730, then the event processing concludes 740. If the category is configured to be logged, then the event is written to non-volatile memory 735, and the event processing concludes 740.

Figure 7A:
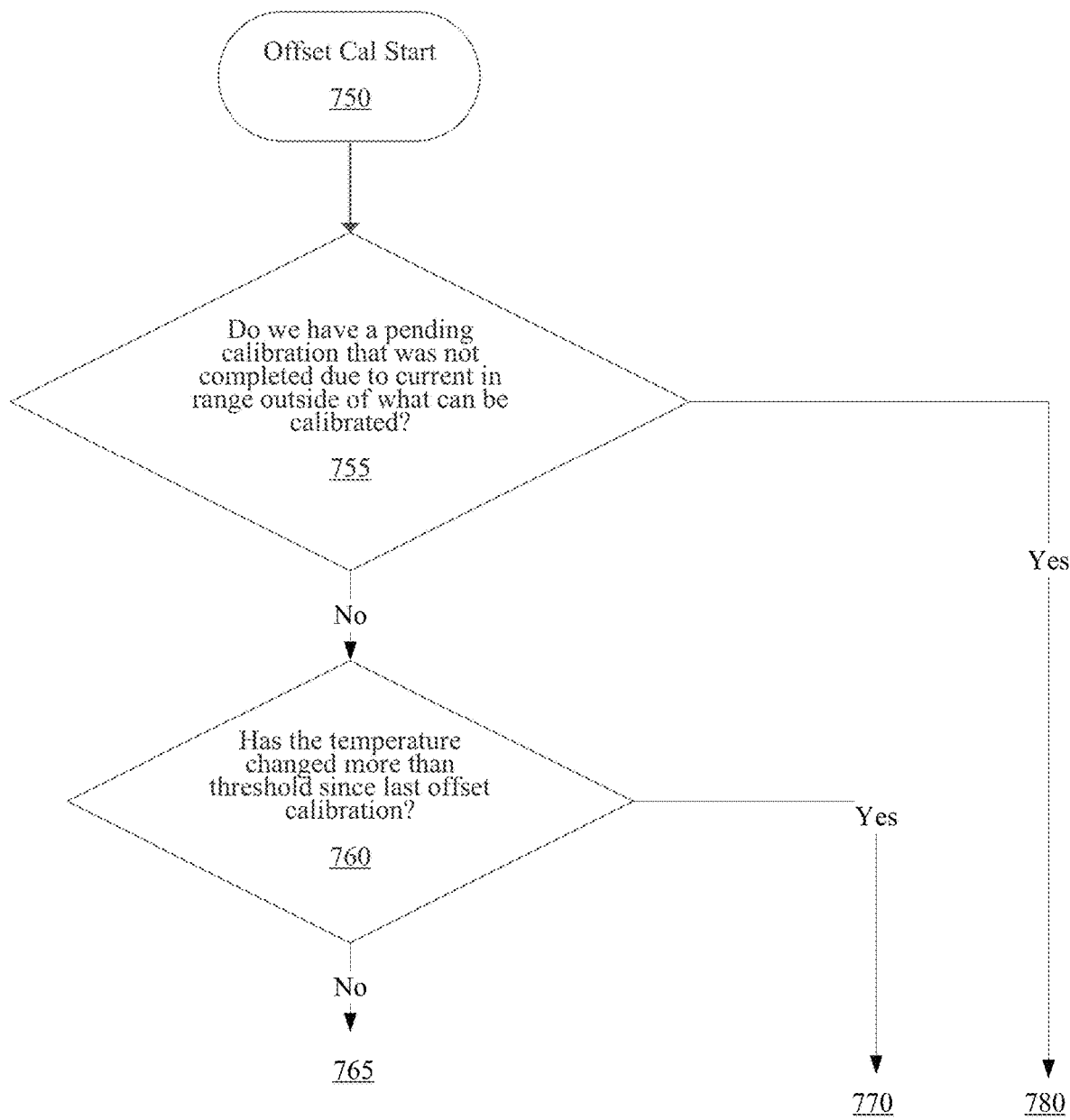
FIG. 7A and FIG. 7B show a detailed flow chart for an example offset calibration calculation for wide dynamic range current measurement with consumption event analysis in accordance with embodiments of the present disclosure.
Figure 7B:
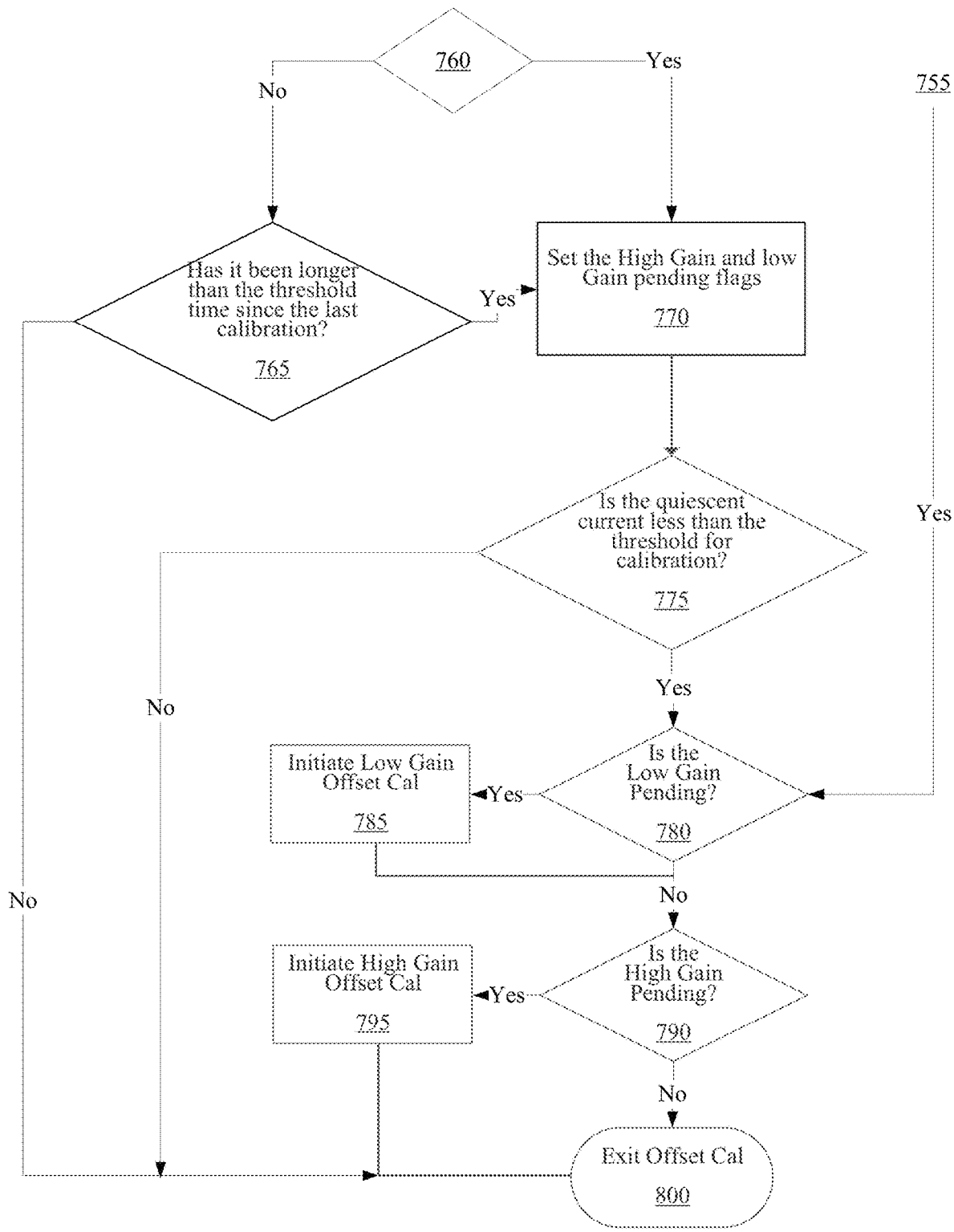

FIG. 7A and FIG. 7B describe the initiation of the amplifier offset calibration 750 process. First, the process determines if there are any pending calibration operations remaining 755. If so, then it may proceed directly to the low gain pending operation check 780. If there are no pending operations, then the process checks to see if the temperature has changed by more than the threshold limit since the last calibration 760. If so, then the pending flags for high gain calibration and low gain calibration are set 770. Otherwise, the process checks to see if it has been longer than the threshold time since the last calibration 765. If so, the pending flags for the high gain calibration and low gain calibration can be set 770. Next, the process checks to see if the quiescent current is less than the threshold for calibrating 775. If not, then the process exits 800 the calibration. Otherwise, the process checks the status of the calibration operations pending, i.e. if the low gain calibration 780 is pending. If the low gain calibration 780 is pending, then the low gain calibration can be initiated 785. If the low gain calibration 780 is not pending, then the process checks to see if the high gain calibration 790 is pending. If the high gain calibration 790 is pending, then the high gain calibration can be initiated 795 followed by a conclusion of the process 800.

If the high gain calibration 790 is not pending, then the calibration process concludes 800.

Figure 8A:
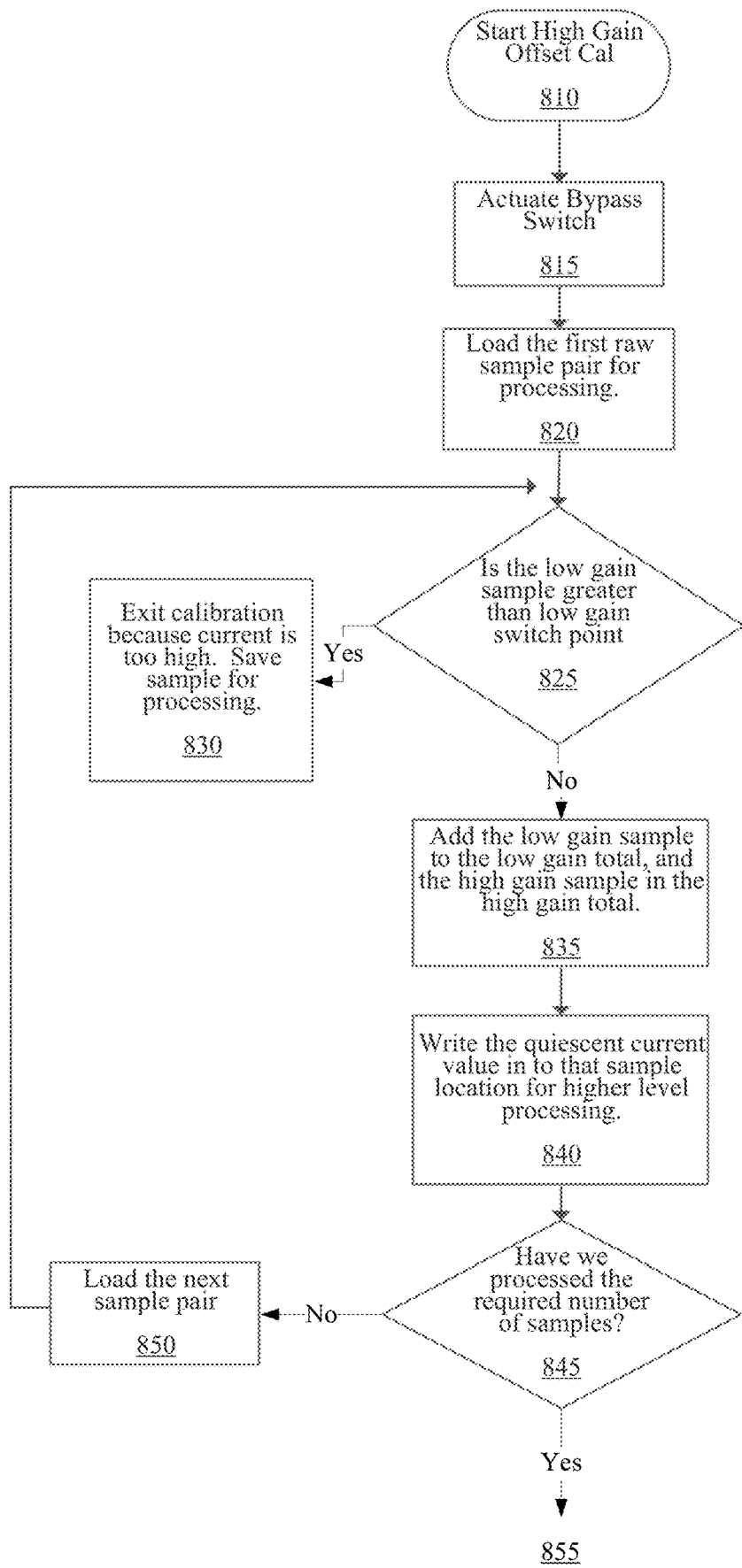
FIG. 8A and FIG. 8B show a detailed flow chart for an example high gain offset calibration calculation for wide dynamic range current measurement with consumption event analysis in accordance with embodiments of the present disclosure.
Figure 8B:
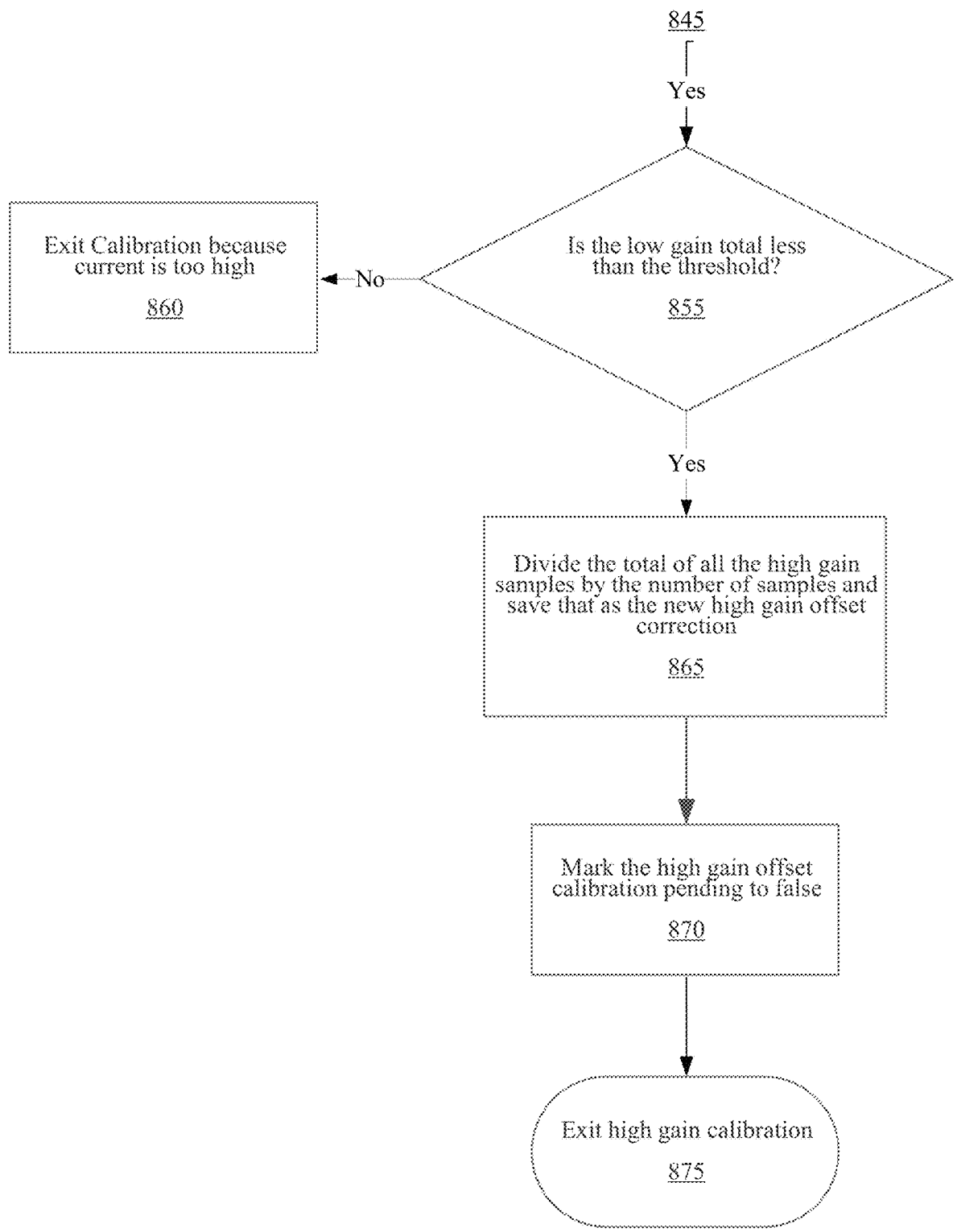

FIG. 8A and FIG. 8B describe the high gain amplifier offset calibration flow. This starts with the initiation 810 of the high gain calibration as shown in FIG. 8A. First, the high gain switch is actuated 815 via the actuation of the bypass switch so that nearly all of the current flows through the low gain burden resistor. Next, the first raw pair of current samples are loaded 820. If the low gain sample is greater than the low gain switch point 825 (i.e. the point in which the low gain sample is the significant one), then the calibration process can be exited 830 because the current is too high. If the low gain sample is less than the switch point 825, then the low gain sample can be added 835 to the low gain total, and the high gain sample can be added 835 to the high gain total. Then, the most recently measured quiescent current value can be loaded into the full range process sample for use in higher level processing 840. If the total number of samples processed is less than the number required for calibration 845, then the next sample pair can be loaded 850 and the process is repeated. Otherwise, the low gain total can be compared against a max threshold for calibration 855. In an example, the max threshold for the calibration is a sum of the current. If the low gain total is greater than the threshold, then the calibration exits 860 because the current is too high. If the low gain total is less than the threshold, then the high gain total is divided 865 by the number of samples used. This value is saved 865 as the new high gain offset calibration correction value. The high gain calibration is then marked not pending 870 and the calibration process exits 875.

Figure 9A:
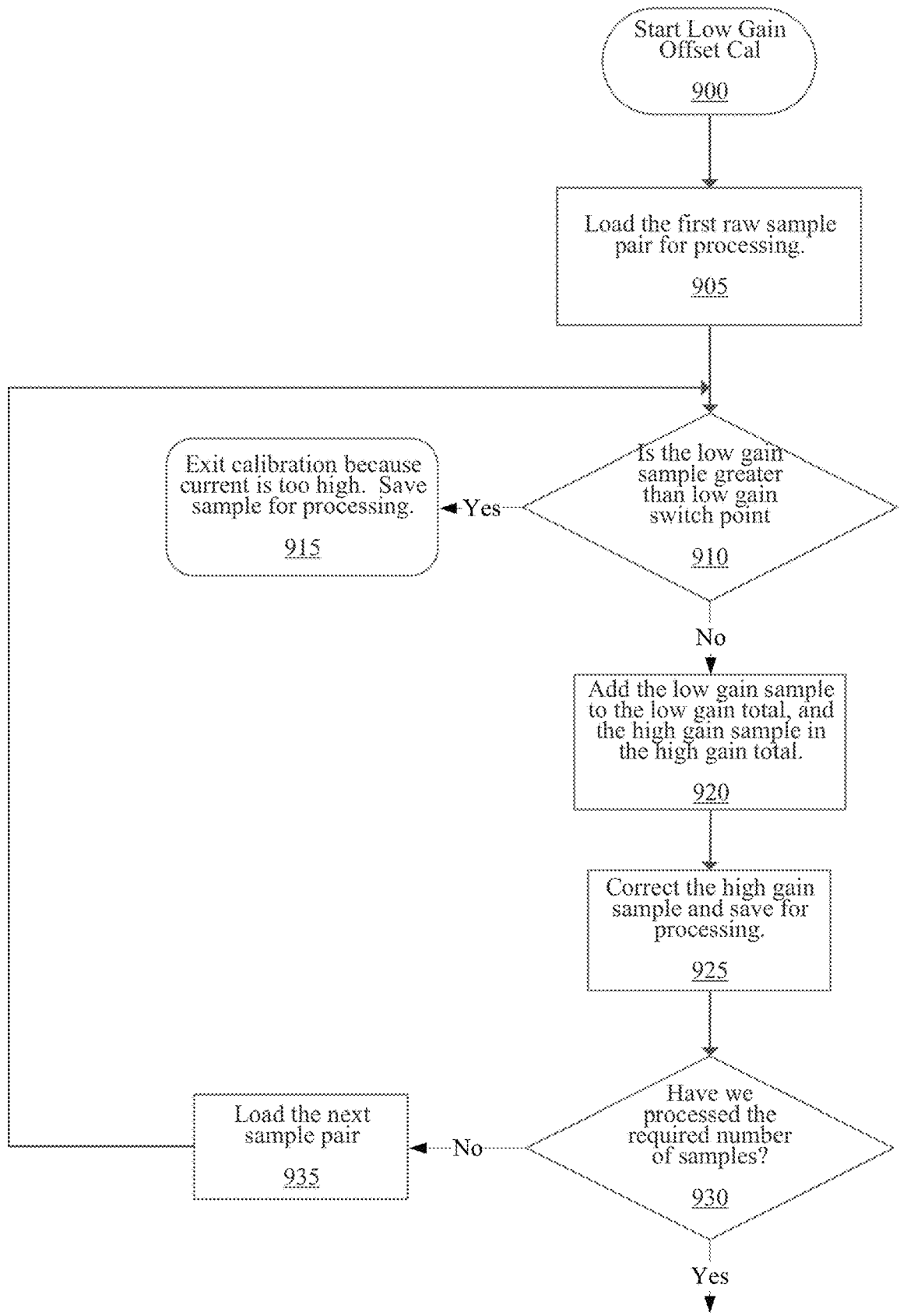
FIG. 9A and FIG. 9B show a detailed flow chart for an example low gain offset calibration calculation for wide dynamic range current measurement with consumption event analysis in accordance with embodiments of the present disclosure.
Figure 9B:
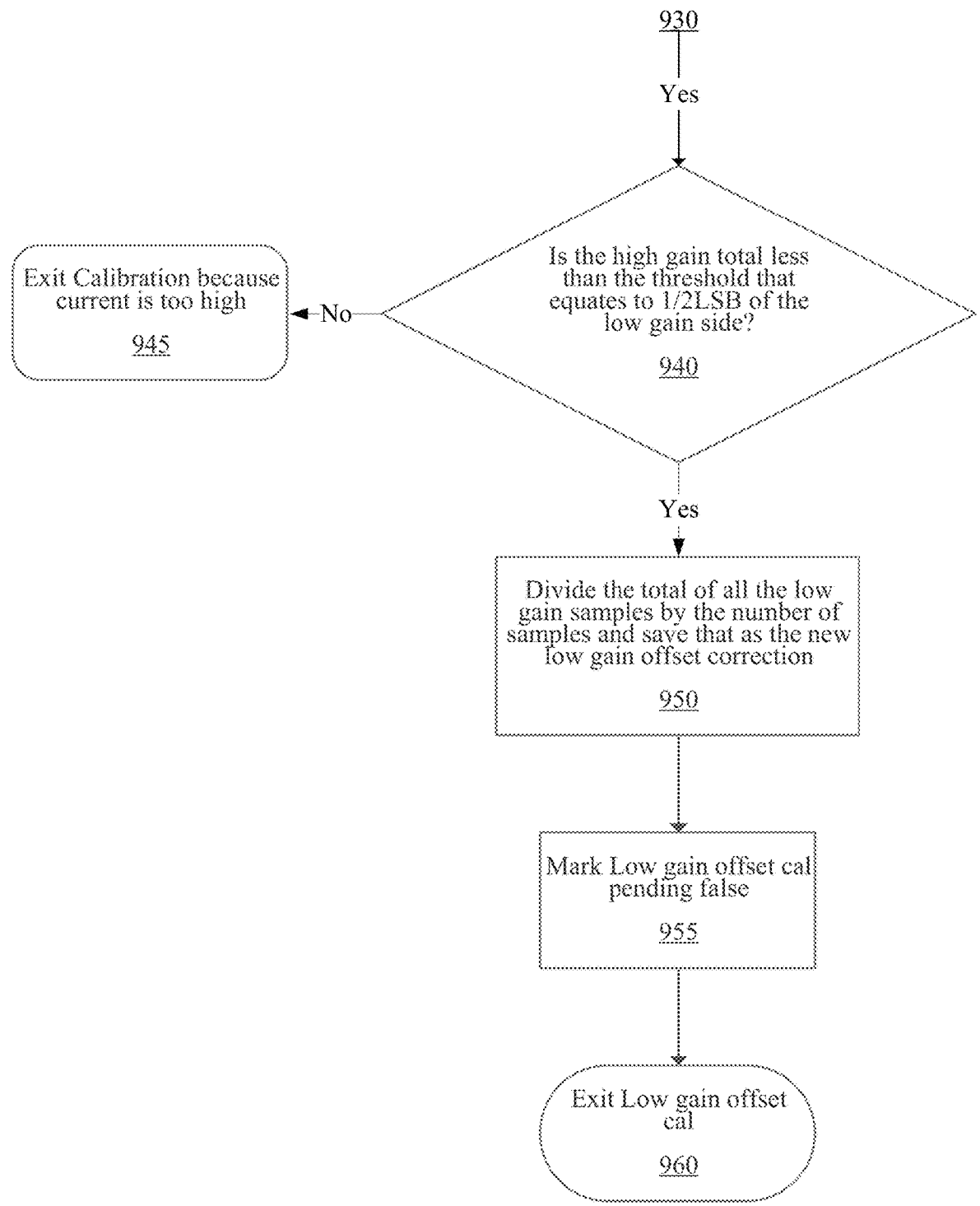

FIG. 9A and FIG. 9B describe the low gain amplifier offset calibration flow. This starts with the initiation 900 of the low gain calibration as shown in FIG. 9A. First, a pair of raw samples are loaded 905 in for processing. If the low gain sample is greater than the low gain switch point 910, then the current is too high, and the calibration process is exited 915. Otherwise, the low gain sample is added 920 to the low gain total, and the high gain sample is added 920 to the high gain sample. Next, the high gain sample is corrected and saved for higher level processing 925. If the total number of samples processed is less than the total samples required for calibration 930, then the next sample pair is loaded 935, and the process is repeated. Otherwise, the sum of the high gain samples is compared 940 to a threshold that equates to ½ of the least significant digit of the low gain analog-to-digital converter times the number of samples. If the sum is greater than the threshold, then the current is too high and the calibration is exited 945. Otherwise, the total is divided 950 by the number of samples and the value is saved 950 as the new low gain offset calibration correction value. Next, the low gain offset calibration is marked no longer pending 955 and the calibration process exits 960.

Figure 10:
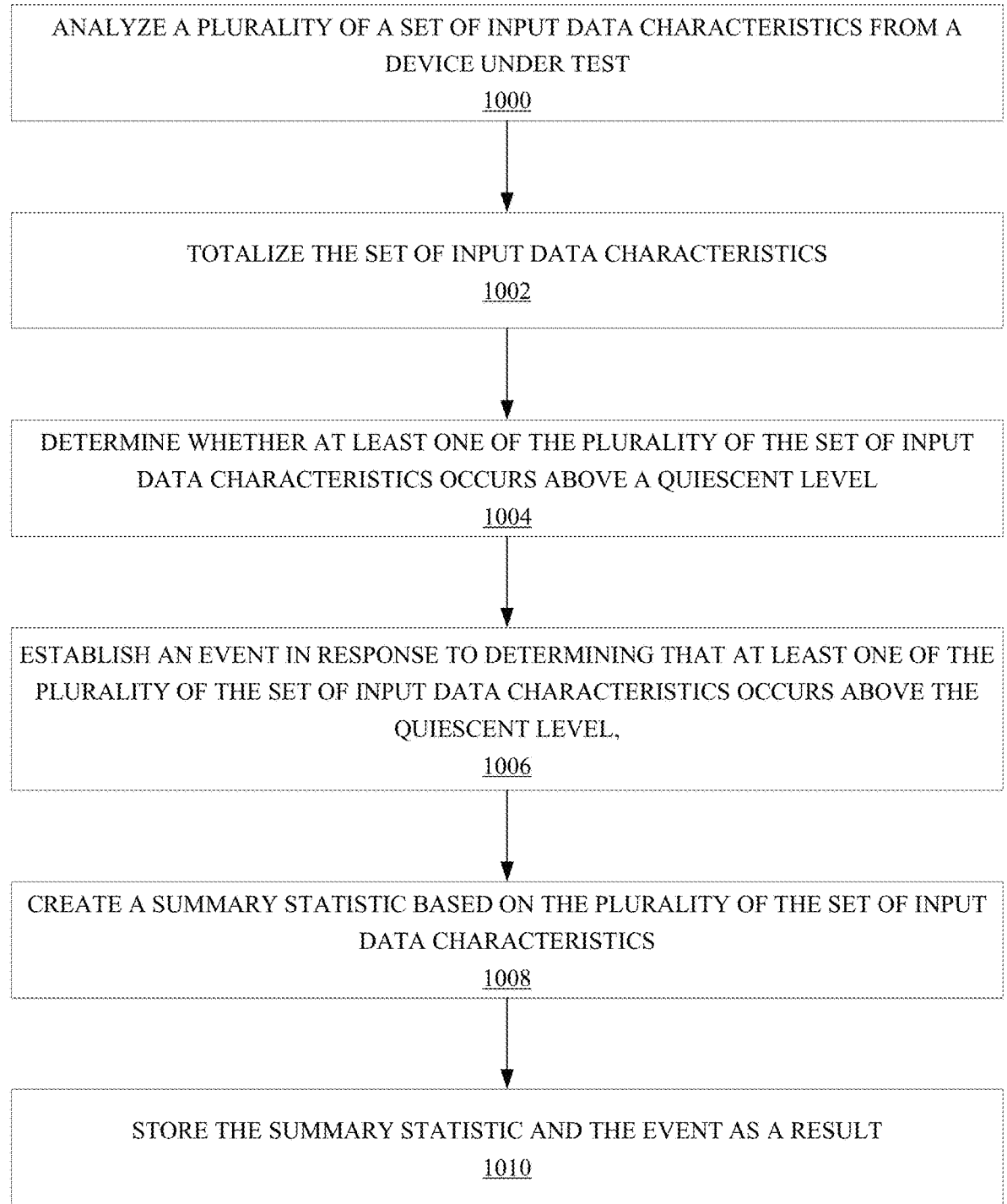
FIG. 10 is a flow chart of an example method for implementing wide dynamic range current measurement with consumption event analysis in accordance with embodiments of the present disclosure.

FIG. 10 is a flow chart of an example method for implementing systems, devices, and methods for a wide dynamic range current measurement with consumption event analysis in accordance with embodiments of the present disclosure. The method of FIG. 10 is described by example as being implemented by the current measurement device 45, 100 as shown in FIG. 1 and FIG. 2, although it should be understood that the method may be implemented by any suitable device(s).

Figure 12:
FIG. 12 depicts an example summary statistic and event for a wide dynamic range current measurement with consumption event analysis in accordance with embodiments of the present disclosure.

Referring to FIG. 10, the method includes analyzing 1000 a plurality of a set of input data characteristics from a device under test 80, 340. In an example, the set of input data characteristics is a current characteristic. The method further includes totalizing 1002 the set of input data characteristics. The method further includes determining 1004 whether at least one of the plurality of the set of input data characteristics occurs above a quiescent level. The method further includes establishing 1006 an event in response to determining that at least one of the plurality of the set of input data characteristics occurs above the quiescent level. In an example, the event is a metadata comprising an amount of a set of input data characteristic above the quiescent level, a duration of time correlating to the set of input data characteristic above the quiescent level, and a time point at which the set of input data characteristic above the quiescent level occurs. The method also includes creating 1008 a summary statistic based on the plurality of the set of input data characteristics. In an example, the summary statistic comprises an individual total of the event, a predetermined category, an average of the set of input data characteristics, a quiescent set of input data characteristics, an instantaneous set of input data characteristics, an active percentage of a time duration in the event, and an elapsed total time. As subsequently described below, FIG. 12 shows an example embodiment of the summary statistic and events. The method also includes storing 1010 the summary statistic and the event as a result on a PC 10, 310, 320, 330. This result can then be presented to a user via a graphical interface on a computing device, such as a PC 10, 310, 320, 330, as subsequently shown in FIG. 12. The method in FIG. 10 of the analyzing, totalizing, determining, establishing, creating, and storing steps are continuously done and updated as a plurality of additional sets of input data characteristics are obtained. That is, these steps are continuously performed as additional current characteristics are obtained from the device under test 80, 340.

Figure 11:
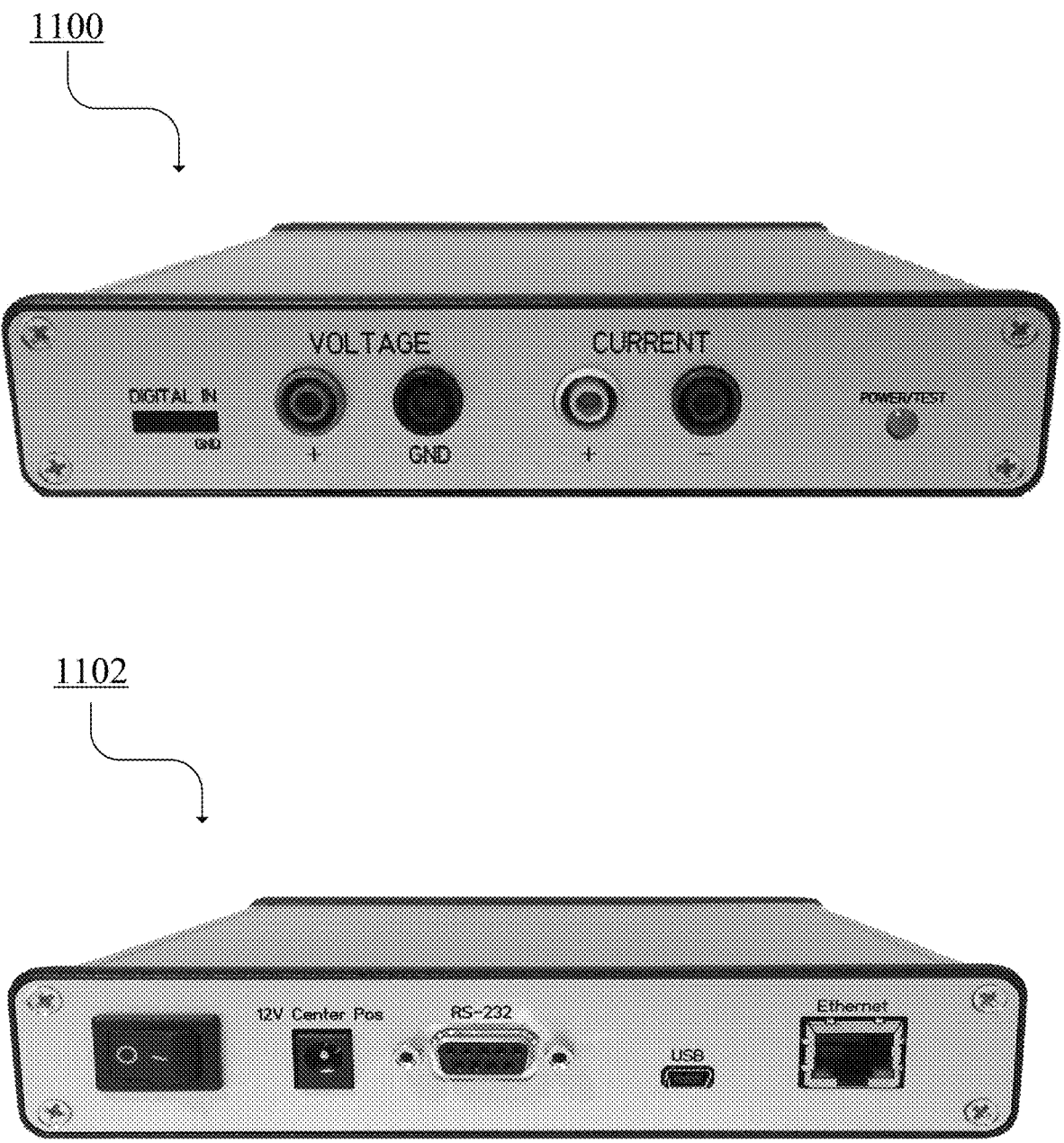
FIG. 11 depicts an example current measurement device for a wide dynamic range current measurement with consumption event analysis in accordance with embodiments of the present disclosure.

FIG. 11 depicts an example current measurement device 45, 100 in accordance with embodiments of the present disclosure. The front 1100 of the device shows the input ports. In an example, the device under test 80, 340 is connected to the current input ports. The back 1102 of the device shows the communications 40 interface connections, specifically the ethernet interface 190, the USB interface 200, and the serial interface 210.

FIG. 12 depicts an example summary statistic and event for a wide dynamic range current measurement with consumption event analysis in accordance with embodiments of the present disclosure. As can be seen, the result 1010 as displayed on a graphical user interface 1200 comprises of a summary statistic 1008 and a summary of the events. As previously mentioned, the summary statistic, in an example, comprises an individual total of the event, a predetermined category, an average of the set of input data characteristics, a quiescent set of input data characteristics, an instantaneous set of input data characteristics, an active percentage of a time duration in the event, and an elapsed total time. This can be seen here wherein the result as displayed on the graphical user interface 1200 show the total consumption, average current, number of events recorded, number of uncategorized events, start time, elapsed time, quiescent current, instantaneous current, and active percentage.

Figure 13:
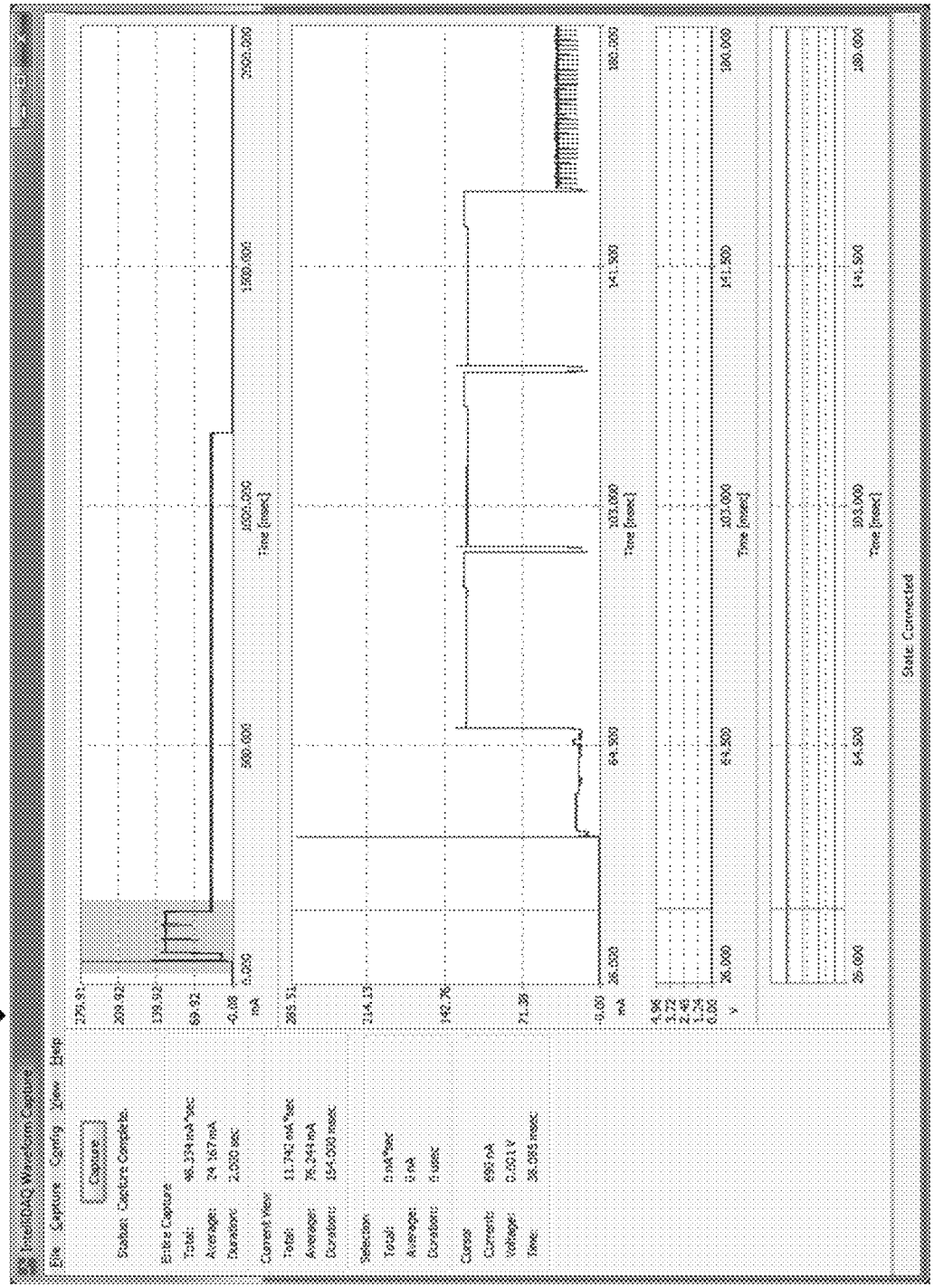
FIG. 13 depicts an example waveform capture for a wide dynamic range current measurement with consumption event analysis in accordance with embodiments of the present disclosure.

FIG. 13 depicts an example waveform capture for a wide dynamic range current measurement with consumption event analysis in accordance with embodiments of the present disclosure. As previously stated, the waveform capture software 15 can be used to visualize and analyze the raw current, voltage, and digital data in a graphical view 1300 when the current measurement device 45, 100 is set to the waveform capture mode. As shown in FIG. 13, the graphical view of the waveform capture mode 1300 can display the current, voltage, and time of the capture. The graphical view of the waveform capture mode 1300 can also display the current consumption and duration.

Figure 14:
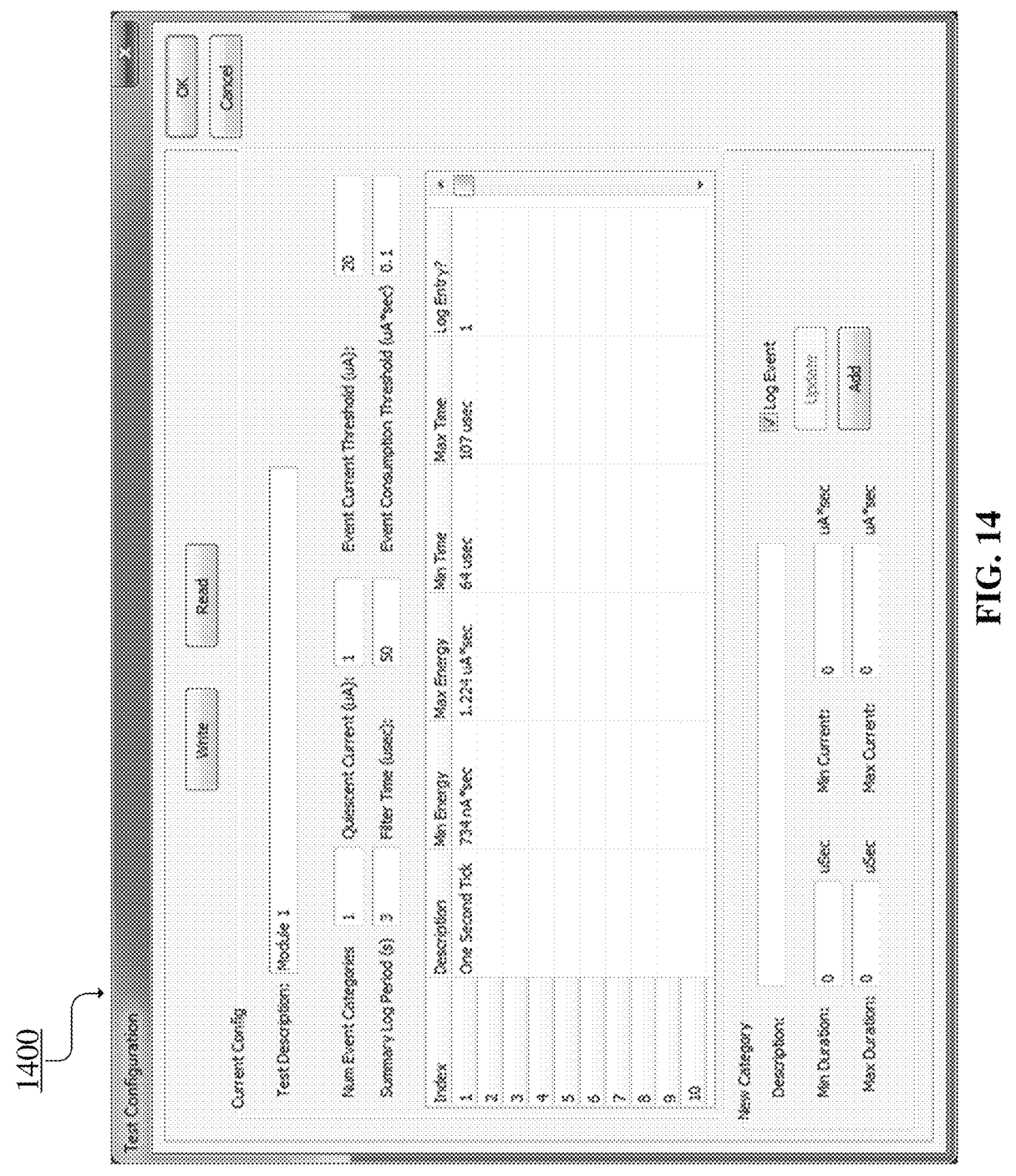

FIG. 14 depicts an example test configuration for a wide dynamic range current measurement with consumption event analysis in accordance with embodiments of the present disclosure. The test configuration 1400 is a set of predetermined thresholds for defining an event and a plurality of predetermined categories. Once established, the test configuration 1400 can be used to determine whether the set of input data characteristics, such as the input current, obtained from the device under test 80, 340 via the current measurement device 45, 100 matches a predetermined category or event. FIG. 14 shows the various parameters that can be set to establish the test configuration 1400, such as the test description, event current threshold, and event consumption threshold, to name a few.

Examples that can embody the presently disclosed subject matter are now described in more detail. The current measurement device 45, 100 in addition to current measurement, can provide a voltage input and a parallel digital input. These inputs allow other signals to be measured in synch with the current, so that they can be compared at any time. The way the device 45, 100 can measure over such a large range is that it uses two differently sized burden resistors that are automatically switched based on the input current. In an example, the resistors are 100 mΩ and 10Ω. The resistors are typically sized so that the high gain side is 100 times larger than the low gain side. The low gain side is always in the current path and the high gain side is bypassed when the current exceeds a certain threshold. Each burden resistor is measured with its own amplifier chain 130 and feeds its own analog-to-digital converter. In an example, the converters are typically 16 bits in resolution and run at 1 MHz. In order to accurately measure current at any location in a circuit, as well as the voltage, the entire current measurement section 130 is electrically isolated from the rest of the circuit, so that the measurements do not have to share a common reference point.

In accordance with the disclosed embodiments, a current measurement device 45, 100 can run in two different modes: data capture mode (also known as waveform capture mode 15 because the signals can be visualized), and continuous measurement mode 20. In data capture mode, the device may operate as a data capture instrument and may send the current, voltage, and digital data over a high-speed link 190 (for example, a USB link 200) to a PC 310, 320, 330. The software on the computer can apply user selected triggers to the data to select the window of data to view and analyze. The software can override the automatic bypass mode to always use the low gain mode to get a more accurate view of the fast transitions in the mid-to-high current ranges. In addition, the software can run in an extended capture mode to identify any departures from quiescent current. A user may program the device under test 80, 340 to output digital signals that go into the parallel digital input that correspond to known activity on the device under test 80, 340. The software can calculate the range of current consumption and the active time for each event, identifying them by the digital input lines. This data may be used to make a test configuration 1400 for the continuous measurement mode.

In the continuous measurement mode, the device 45, 100 can process the current data and can sum up all of the current used. Additionally, the device 45, 100 can monitor the current to determine whether the current exceeds a predetermined threshold (either user programmed or determined by an automatic configuration mode). In response to the current exceeding the threshold, the device 45, 100 can keep track of the total current consumed, as well as the peak current and the min/max voltage for the duration of the higher current event. Once the current drops below the threshold, the device 45, 100 can package the captured data, the time that this occurred at and the duration, and log this information. Additionally, the device 45, 100 can compare the captured data to a number of predetermined categories to see if it is one of the known event types. If it is one of the known event types, then the device 45, 100 can add the total consumption to a category total and can increment the number of occurrences. If it does not fit within a category, the uncategorized group can store the total. The presence of uncategorized events can indicate that the test configuration 1400 did not fully describe the device under test. These totals can be used by the device 45, 100 to provide a summary statistic of the amount of current used for each type of operation the device does and can be reported whenever a user reads the status (including total consumption) from the device 45, 100. In addition to this information, when using the large memory version of the device 45, 100, the entire waveform from an event can be logged (this can be configured for all events or just the uncategorized events). In one embodiment, the uncategorized events can automatically create a new category using pre-defined tolerances, so that like uncategorized events can be grouped together. This allows the user to easily make changes to the test configuration 1400 to fully meet the behavior of the device under test 80, 340.

One of the issues with running over a long period of time is that temperature changes can cause the offsets of the amplifiers to drift. To calibrate these offsets 750 without removing the connection to the device under test 80, 340, the device 45, 100 can periodically (either on a fixed time basis, or when the temperature has changed a certain amount) actuate the bypass circuit 460 during periods of low current consumption. The device 45, 100 may record the average reading during this time and monitor the value on the low gain side. As long as the low gain side indicates that the device is in a low current mode, then the device 45, 100 can use the average of the high gain readings to compute the new high gain offset and sum in the previous period's low current average into the total. If the current increases above the normal low current threshold, then the device 45, 100 can stop the accumulation of the offset calibration data since the bypass path is not a perfect short circuit and the accuracy of the measurement can be affected. Once the offset is calculated and applied, the device 45, 100 can return to normal operating mode. In normal operating mode, the device 45, 100 can validate and adjust the offset on the low gain side during a time of minimal current consumption. As long as the current is less than ½ of the value of the least significant digit of the low gain side, the average value read should equal the offset value. This is validated and adjusted in the period after the calibration of the high gain side.

We now turn to an example application of using the current measurement device 45, 100 by first examining an example device under test 80, 340. In an example, a device under test 80, 340 is a battery powered device that has a very wide dynamic range with a network module to read water meters. These devices 80, 340 typically operate on a non-rechargeable, non-replaceable battery that must last 20 years, so it is very important that they not use more current than can be pulled from the battery over its lifetime. These devices typically have a quiescent current of approximately 2 uA. They typically wake up once a second to update the calendar, check for scheduled events, and poll an onboard Hall Effect sensor. This typically takes about 100 usec and draws an average current around 10 mA, which is categorized as a one second tick. Typically, every hour, the module can read the water meter taking ~1 second to do so and draws about 15 mA of current. This is characterized as a meter read. Typically, every 4 hours, the module would do a RF transmit for 100 msec at 1 A of current and then go into a receive mode for ~1 second at 50 mA to get an acknowledgment. This is characterized as a scheduled transmit. Another variation of this transmit is where the acknowledgement has a request built in. This requires the module to do another transmit after the receive period and is characterized as a scheduled transmit with a transaction.

Staying with the example of the battery powered device that has a very wide dynamic range with a network module to read water meters, to generate a configuration for this device 80, 340, the event thresholds must be set so that the upper threshold is well above the quiescent current, but well below the typically current levels of the events. The lower threshold must be above the quiescent current plus any noise that is likely to be on the line. Typically, this is set halfway between the upper threshold, and the quiescent current. To generate the event categories, a user would typically apply a fixed variance (such as +−10%) of the typical values. The amount of this variance depends on how consistent the time and energy consumption are for the events. Below is an example set of thresholds and configuration parameters used to monitor this example device 80, 340, as summarized in Table 1:

Event Upper threshold: 20 uA
Event Lower Threshold: 11 uA
Rising filter Threshold: 3
Category thresholds:

TABLE 1

Summary of the categories, current thresholds, time thresholds, and event log.

| Category | Lower Current Threshold | Upper Current Threshold | Lower Time Threshold | Upper Time Threshold | Log Event? |
|---|---|---|---|---|---|
| One Second Tick | .9 uA*sec | 1.1 uA*sec | 90 usec | 110 usec | No |
| Meter Read | 13.5 mA*sec | 16.5 mA*sec | 900 msec | 1100 msec | Yes |
| Scheduled Transmit | 135 mA*s | 165 mA*sec | 990 msec | 1210 msec | Yes |
| Scheduled Transmit with transaction | 225 mA*sec | 275 mA*sec | 1080 msec | 1320 msec | Yes |

Continuing with the example above, i.e. the device under test 80, 340 is a network water module as described above, starts a meter read, transitioning from the quiescent current of 2 uA to an active current of 15 mA at 100 sec into the test time while staying above the quiescent current for 1 sec. Using this example device 80, 340, we now run through a process flow as previously described in the present disclosure. The samples received 550 from the example device under test 80, 340 come in at a rate of one every microsecond. As shown in FIG. 5A and FIG. 5B, while in quiescent current, the flow goes from 550 to the event check 555 and then to the upper threshold check 560. When this threshold check 560 fails, the filter count is set to zero 590 and the process goes to the next sample 640. After the current jumps to 15 mA, it passes the threshold check 560 because the current is above 20 uA. The filter count is then incremented 565 to one, but because it is below the threshold of 3, the comparison 570 still fails. After the fourth sample occurs at 15 mA, the filter count is at 4, which is greater than the threshold of 3, so the threshold comparison 570 passes. As such, the start time of the event, 100.000003 seconds is recorded, and the system records that it is in an event 580. Subsequent samples pass through the event check 555 and add their value to the event total 600. Each sample that is higher than any other samples since the event started passes the check 605 and can have their value recorded 610. While the current is high, the check for the lower threshold 615 still fails, and the filter count can be set to zero 620 and the processing repeats. At the end of the meter read, the current drops down to 2 uA. At this point, when the processing hits 615, it passes the threshold, because the current is lower than 11 uA. The filter count can then be incremented to one 625, but because the filter count is less than 20, the threshold check 630 still fails. After 21 samples of low current, the filter count check passes, and the event can be recorded 635. The total current consumed can be recorded as 15 mA*seconds (which is stored as raw counts in units of the least significant bit of the analog-to-digital converter), as well as the end time of 101.000020 seconds. This processing may continue as shown in FIG. 6A and FIG. 6B.

We continue with the example operation of the previous paragraph but now refer to FIG. 6A and FIG. 6B. The total consumption can be converted 655 to an actual current consumption value from the raw counts. The total consumption of 15 mA*sec is then compared against the minimum event threshold of 0.1 uA*sec 660, which passes. The event duration is then calculated as 1.000017 msec by subtracting the event start time from the end time 665. The event duration is then corrected by adding 670 the rising filter time of 3, and subtracting the falling filter time of 20 resulting in a total duration of 100 msec. The event duration is then added 675 to the total active time used for summary statistic information. Next, the threshold from the first category, i.e. the one second tick, is loaded in 680. The total consumption, and duration of the event are compared against the threshold 685, which fails because the total current is above the upper current threshold and the duration is greater than the upper time threshold. The check for more categories 690 passes, because we have only checked one of the 4 categories, so the next category, "Meter read", is loaded in 710. The current consumption of 15 mA*sec is in between the lower and upper current thresholds, and the duration of 100 msec is between the lower and upper time thresholds, so the comparison 685 passes. The category of this event is then assigned to the category "Meter read" at 715 and then the number of occurrences of "Meter read" is incremented 720. The event total is then added 725 to the total for "Meter read". The check to log the event passes 730 because this event is configured to be logged, so the event is written to non-volatile memory 735, which concludes the processing of this event 740.

The present subject matter may be a system, a method, and/or a computer program product. The computer program product may include a computer readable storage medium (or media) having computer readable program instructions thereon for causing a processor to carry out aspects of the present subject matter.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present subject matter may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present subject matter.

Aspects of the present subject matter are described herein with reference to flowchart illustrations and/or block diagrams of methods, apparatus (systems), and computer program products according to embodiments of the subject matter. It can be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present subject matter. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It can also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the embodiments have been described in connection with the various embodiments of the various figures, it is to be understood that other similar embodiments may be used or modifications and additions may be made to the described embodiment for performing the same function without deviating therefrom. Therefore, the disclosed embodiments should not be limited to any single embodi-

What is claimed:

1. A method for validating energy consumed by a battery powered device under test, the method comprising:
   at a current measurement instrument including a current sensor connected in series between a power supply and the device under test being powered by the power supply:
   using the current sensor to measure samples of current flowing from the power supply to the device under test;
   transferring the measured samples of current to a processor on a per sample basis;
   using the processor for:
   summing the samples of current on a per sample basis for calculating total energy consumption of the device under test;
   storing the summation of the samples of current as a summary statistic on a per sample basis;
   monitoring each sample of current on a per sample basis to determine whether a level of the sample of current exceeds a predetermined threshold level; and
   in response to determining that the level of the sample of current exceeds the predetermined threshold level:
   determining that the device under test is in a current event;
   creating an event data item that indicates a timestamp indicating when the predetermined threshold level was exceeded, a summation of current samples that occurred above the predetermined threshold level, and the amount of time that the samples of current were above the predetermined threshold level; and
   storing, subsequent to determining that the current is lower than the predetermined threshold level, the event data item in a log of one or more event data items for use in analysis of the energy consumption of the device under test.

2. The method of claim 1, further comprising:
   performing a set of offset calibration on an analog signal chain;
   determining whether a previous set of offset calibration is pending, whether a temperature has changed above a predetermined temperature threshold, and whether a time duration between calibration is above a predetermined time threshold;
   selecting at least one of a high gain offset calibration and a low gain offset calibration based on determining whether the previous set of offset calibration is pending, whether the temperature has changed above the predetermined temperature threshold, and whether the time duration between calibration is above the predetermined time threshold; and
   engaging one of at least two of a burden resistor to calibrate the set of input data characteristics.

3. The method of claim 2, wherein one of at least two of the burden resistor can be bypassed with a semiconductor switch to enable the analog signal chain linked to the one burden resistor to calibrate the offset associated with multiple amplifiers on the analog signal chain of the one burden resistor.

4. The method of claim 3, wherein bypassing with the semiconductor switch occurs at a time of low current consumption and comprises of substituting a previously measured quiescent current for a current that is normally measured across the burdened resistor that has been bypassed.

5. The method of claim 3, wherein calibrating the offset comprises of calculating an offset of a low gain analog signal chain that comprises of measuring an average analog value of the low gain analog signal chain during a time period when an average value of a high gain side is less than one-half of an equivalent least significant bit of a low gain analog-to-digital converter.

6. The method of claim 1, wherein the summary statistic comprises the total of the samples of current, an average of the samples of current, a quiescent current calculated from the samples of current, an instantaneous current calculated from the average of the samples of current over a recent period of time, an active percentage of a time duration in an event, and an elapsed total time.

7. The method of claim 1, wherein the analyzing, summing, determining, establishing, creating, and storing steps are continuously done and updated as a plurality of additional samples of current are obtained.

8. The method of claim 1, further comprising presenting the result to a user via a graphical interface on a computing device.

9. The method of claim 1, further comprising:
   comparing the summation of the samples of current and the time the samples were above the predetermined threshold level in the event data item with a list of high and low thresholds for current and time representing different predetermined categories of current events;
   determining whether the summation and time fall between the thresholds of one of the predetermined categories; and
   in response to determining that the summation and time fall between the thresholds of one of the predetermined categories:
   assigning the category to the event data item prior to the storing the event data item; and
   adding the current summation and time of the event data item to the corresponding category of a list of category summations of current and time in the summary statistic.

10. The method of claim 9, wherein determining that there is a match results in a plurality of matches with the plurality of the predetermined categories comprises assigning the event data item to the predetermined category that first results in a match.

11. The method of claim 9, further comprising:
    determining whether the event data current summation and time fall between the thresholds of one of the predetermined categories; and
    in response to determining that there is not a match, assigning the event data item to an uncategorized category.

12. The method of claim 9, further comprising:
    determining whether the event data current summation and time fall between the thresholds of one of the predetermined categories;
    in response to determining that the samples of current do not meet a predetermined category, creating a new category based on a predefined tolerance applied to the samples of current and its duration; and
    assigning event data item to the new category.

13. The method of claim 9, further comprising:
    identifying the predetermined category based on a test configuration;
    generating a definition for the predetermined category; and
    presenting the definition to a user to review.

14. The method of claim 13, wherein the test configuration is a set of predetermined thresholds for defining the event and a plurality of predetermined categories.

15. The method of claim 1, further comprising:
sampling simultaneously at least one set of a plurality of digital and analog inputs that are electrically unreferenced to the set of input characteristics with the samples of current simultaneously to keep the samples in synchronization;
selecting at least one set of the plurality of digital and analog inputs that are electrically unreferenced to the samples of current;
establishing at least one of the plurality of digital and analog inputs as a trigger to identify the predetermined category; and
presenting the trigger to a user via a graphical interface to review.

16. The method of claim 15, further comprising:
selecting at least one set of the plurality of digital inputs to engage a self-identify operation of a device under test;
identifying, automatically, a predetermined category based on the self-identify operation; and
presenting the predetermined category to a user via a graphical interface to review.

17. The method of claim 1, further comprising:
timestamping a predetermined category and an operation of the device under test via a network time protocol;
resynchronizing the timestamp via the network time protocol after a power loss; and
continuing the operation of the device under test after the resynchronization.

18. The method of claim 1, further comprising:
converting the sum of the samples of current of an event to an engineering unit, Ampere Seconds via application of a calibration factor;
calculating the event duration based on whether the event is above a predetermined event threshold; and
assigning the event and the event duration to a predetermined category based on whether the event fits within the predetermined category.

19. The method of claim 18, wherein calculating the event duration comprises:
determining whether the event is above the predetermined event threshold;
in response to determining that the event is above the predetermined event threshold, computing the event duration; and
adding the event duration to a total active computation time.

20. The method of claim 18, wherein assigning the event and the event duration to the predetermined category comprises:
loading the predetermined category;
determining whether the event and the event duration fits within the predetermined category; and
in response to determining that the event and the event duration fits within the predetermined category, assigning the event and the event duration to the predetermined category via addition of the event and the event duration to the predetermined category.

21. The method of claim 18, further comprising:
determining whether the predetermined category is configured to be logged in at least one of a processor and memory of a computing device; and
in response to determining that the predetermined category is to be logged, storing the predetermined category to at least one of the processor and memory of the computing device.

22. A system for validating energy consumed by a battery powered device under test, the system comprising:
a current sensor configured to be connected in series between a power supply and the device under test being powered by the power supply, the current sensor being configured to measure samples of current flowing from the power supply to the device under test,
a current measurement device configured to:
sum the samples of current on a per sample basis for calculating total energy consumption of the device under test;
store the summation of the samples of current as a summary statistic on a per sample basis;
monitor each sample of current on a per sample basis to determine whether a level of the sample of current exceeds a predetermined threshold level; and
in response to determining that the level of the sample of current exceeds the predetermined threshold level:
determine that the device under test is in a current event;
create an event data item that indicates a timestamp indicating when the predetermined threshold level was exceeded, a summation of current samples that occurred above the predetermined threshold level, and the amount of time that the samples of current were above the predetermined threshold level; and
store, subsequent to determining that the current is lower than the predetermined threshold level, the event data item in a log of one or more event data items for use in analysis of the energy consumption of the device under test.

23. The current measurement device of claim 22, wherein the device is operable in at least one of a data capture mode, an extended data capture mode, and a continuous measurement mode.

24. The current measurement device of claim 23, wherein in the data capture mode, the device:
obtains the samples of current supplied to the device under test;
sends data representing the samples of current to a computing device via a communications interface;
engages a software on the computing device to apply user selected triggers to the data to view on a graphical interface;
analyzes the data; and
presents the analysis to a user via the graphical interface.

25. The current measurement device of claim 23, wherein in the extended data capture mode, the device:
obtains the samples of current supplied to the device under test;
sends data representative of the samples of current to a computing device via a communications interface;
engages a software on the computing device to apply user selected triggers to the data to view on a graphical interface;
analyzes the data;
identifies a deviation of the data from a quiescent level through a creation of an output digital signal from the device under test that goes into a parallel digital input that corresponds to an operation of the device under test;
calculates a range of data consumption and an active time for each event that corresponds to the deviation of the data from the quiescent level;
creates a test configuration based on the range of data consumption and the active time for each event; and
presents the analysis and configuration to a user via the graphical interface.

26. The current measurement device of claim 23, wherein in the continuous measurement mode, the device:
- obtains the samples of current supplied to the device under test;
- analyzes data representative of the sample of current to determine whether the data exceeds a predetermined threshold;
- tracks the data in response to determining that the data exceeds a predetermined threshold;
- summarizes the data and its time duration once the data drops below the predetermined threshold; and
- presents the summary to a user via a graphical interface.

27. The current measurement device of claim 26, wherein in the continuous measurement mode, the device further:
- compares the data to at least one of a plurality of predetermined categories;
- determines whether the data matches to at least one of the plurality of predetermined categories; and
- increases a value in the predetermined category via addition of the data to the value in the predetermined category in response to determining that the data matches to at least one of the plurality of predetermined categories.

28. The current measurement device of claim 22, that comprises of at least one of a communications interface module to connect with a computing device that contains at least one of a graphical interface and at least one of a processor and memory, and a plurality of input ports to connect with the device under test.

* * * * *